United States Patent
Ushimi et al.

(10) Patent No.: US 7,663,106 B2
(45) Date of Patent: Feb. 16, 2010

(54) INFRARED SENSOR AND METHOD FOR PRODUCING SAME

(75) Inventors: Yoshimitsu Ushimi, Moriyama (JP); Naoko Aizawa, Yasu (JP); Hiroyuki Fujino, Nagaokakyo (JP); Hajime Yamada, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/264,961

(22) Filed: Nov. 5, 2008

(65) Prior Publication Data

US 2009/0050808 A1    Feb. 26, 2009

Related U.S. Application Data

(63) Continuation of application No. PCT/JP2007/058605, filed on Apr. 20, 2007.

(30) Foreign Application Priority Data

May 10, 2006    (JP) .............................. 2006-131052

(51) Int. Cl.
*G01J 5/00*    (2006.01)
(52) U.S. Cl. .................................. 250/338.1
(58) Field of Classification Search .... 250/338.1–338.5
See application file for complete search history.

(56) References Cited

U.S. PATENT DOCUMENTS

| | | | |
|---|---|---|---|
| 5,193,911 A | | 3/1993 | Nix et al. |
| 5,962,854 A | * | 10/1999 | Endo .......................... 250/349 |
| 6,326,621 B1 | * | 12/2001 | Kamada et al. .......... 250/338.2 |
| 6,432,474 B1 | | 8/2002 | Nakanishi et al. |
| 2002/0069909 A1 | * | 6/2002 | Kubo ......................... 136/224 |
| 2004/0020918 A1 | * | 2/2004 | Kakihara et al. ............. 219/505 |
| 2004/0089854 A1 | * | 5/2004 | Chen et al. .................... 252/570 |
| 2005/0162043 A1 | * | 7/2005 | Higuchi et al. ............... 310/328 |
| 2006/0043297 A1 | * | 3/2006 | Ouvrier-Buffet et al. ..................... 250/339.05 |

FOREIGN PATENT DOCUMENTS

| | | | |
|---|---|---|---|
| JP | 06-160177 A | | 6/1994 |
| JP | 06-194226 A | | 7/1994 |
| JP | 08094433 A | * | 4/1996 |
| JP | 2002-270909 A | | 9/2002 |
| JP | 2004-239708 A | | 8/2004 |

OTHER PUBLICATIONS

Official Communication issued in International Patent Application No. PCT/JP2007/058605, mailed on Jul. 24, 2007.

* cited by examiner

*Primary Examiner*—David P Porta
*Assistant Examiner*—Kiho Kim
(74) *Attorney, Agent, or Firm*—Keating & Bennett, LLP

(57) ABSTRACT

An infrared sensor includes a first substrate made of a thermoelectric conversion material and a second substrate. The first substrate is supported by posts made of an electrode material while being spaced apart from the second substrate. A sensing electrode and lead portions connected thereto are provided on the first substrate. The sensing electrode and the lead portions are covered with an infrared-absorbing film. The posts are connected to the lead portions, and external terminal connection electrodes are connected to the posts.

44 Claims, 15 Drawing Sheets

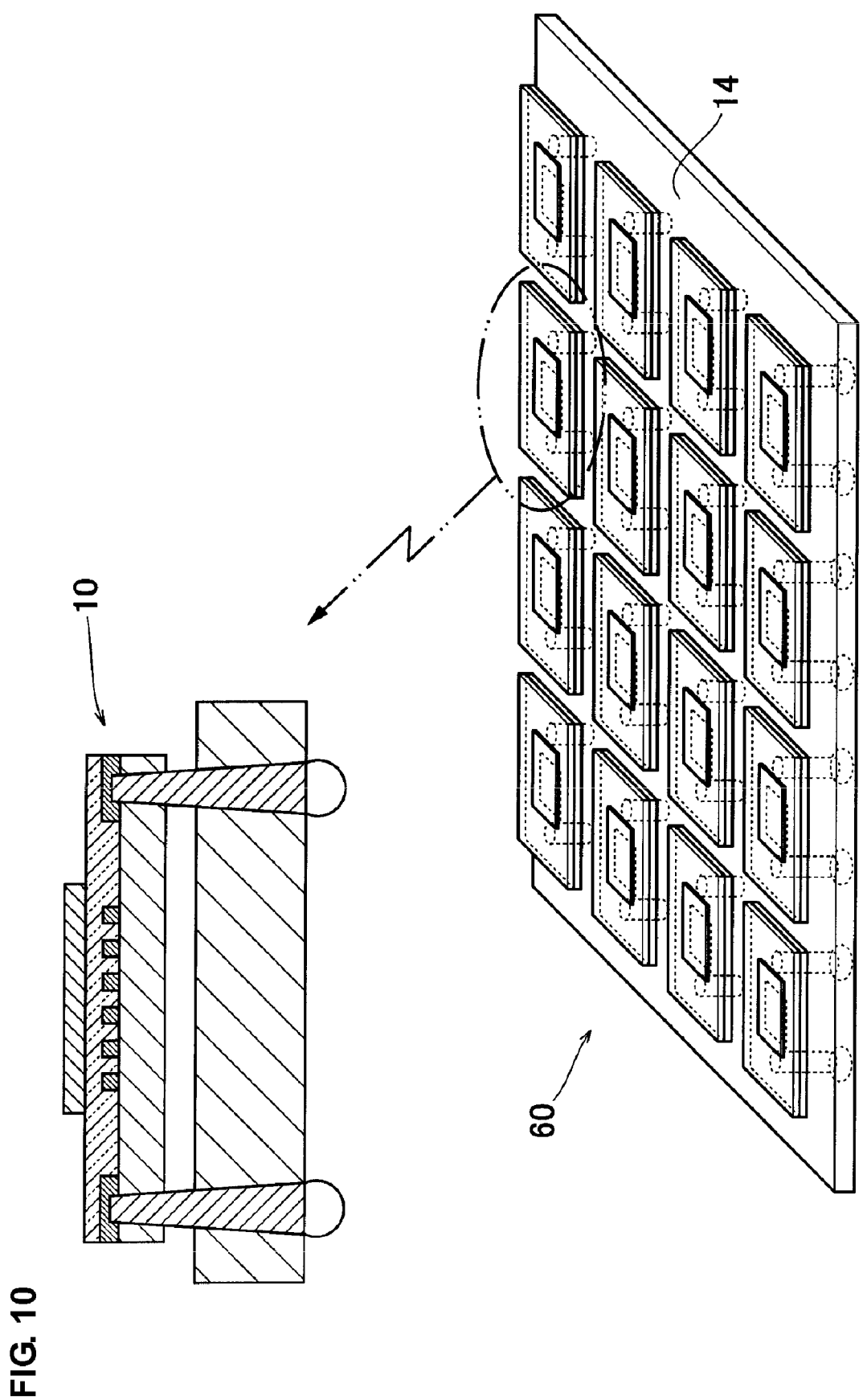

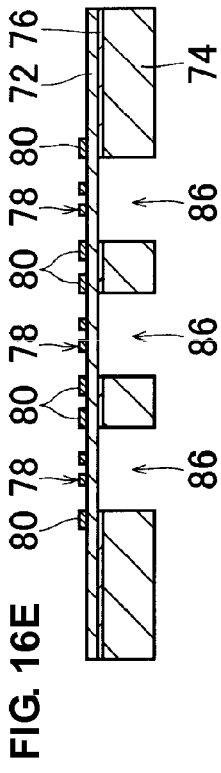
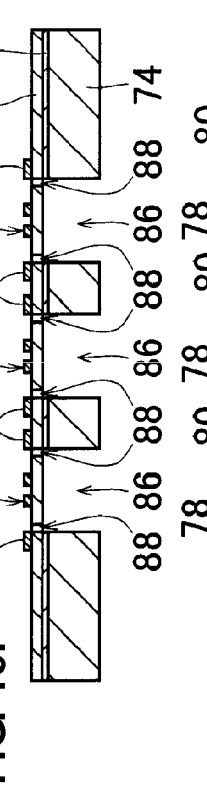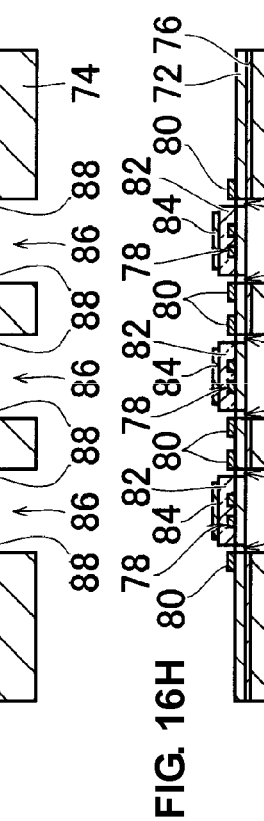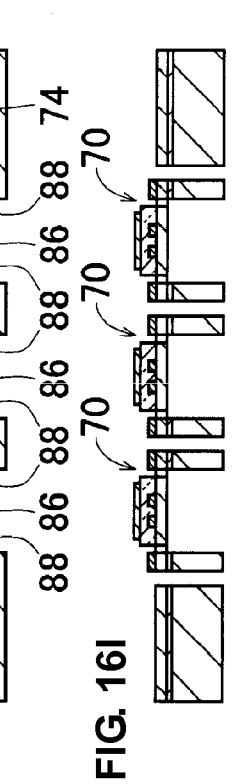
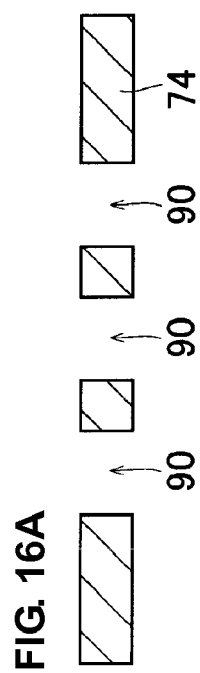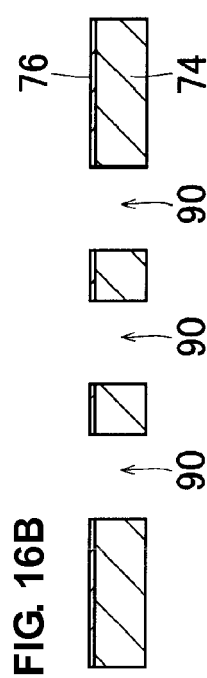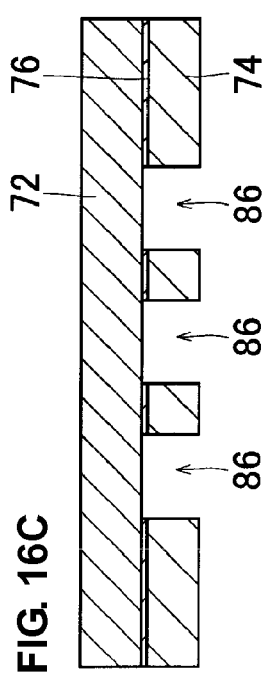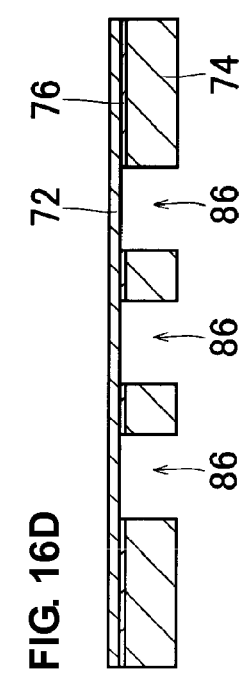
FIG. 16A FIG. 16B FIG. 16C FIG. 16D FIG. 16E FIG. 16F FIG. 16G FIG. 16H FIG. 16I

INFRARED SENSOR AND METHOD FOR PRODUCING SAME

BACKGROUND OF THE INVENTION

1. Field of the Invention

The present invention relates to infrared sensors and methods for producing the infrared sensors. In particular, the present invention relates to, for example, an infrared sensor including an infrared-sensing portion having a sensing electrode on a substrate made of a thermoelectric conversion material and a method for producing the infrared sensor.

2. Description of the Related Art

FIGS. 19A to 19C are illustrative views of an exemplary method for producing an infrared sensor in the related art. To produce the infrared sensor, as shown in FIG. 19A, a substrate 3 made of, for example, Si is prepared. A lower electrode 1 is formed on the substrate 3. A vitreous layer 2 is formed thereon. A Pb thin film 4 is deposited by evaporation on a bonding surface of a PbTiO$_3$-based pyroelectric substrate 5. The Pb thin film 4 on the pyroelectric substrate 5 is brought into contact with the vitreous layer 2 on the substrate 3. Heat treatment is performed at about 600° C. to about 1,000° C. to enable the vitreous layer 2 to react with the Pb thin film 4 to form a low-melting-point vitreous layer 6, thereby stacking the pyroelectric substrate 5 on the substrate 3. Then, as shown in FIG. 19B, the thickness of the pyroelectric substrate 5 is reduced by polishing. A light-receiving surface electrode 7 is formed by sputtering to form an infrared-sensing portion. As shown in FIG. 19C, an insulating film 8 made of, for example, SiO$_2$, is formed on the pyroelectric substrate 5 provided with the light-receiving surface electrode 7. The substrate 3 located on a portion at which the light-receiving surface electrode 7 is arranged is removed by etching to form a Si-substrate-removal portion 9.

In such an infrared sensor, since the pyroelectric substrate 5 is bonded to the substrate 3, the thickness of the pyroelectric substrate 5 can be reduced. The formation of the Si-substrate-removal portion 9 prevents thermal conduction from the portion at which the light-receiving surface electrode 7 is arranged to the substrate 3. Thus, when infrared energy is incident on the infrared-sensing portion, the temperature of the infrared-sensing portion is significantly changed. This results in improved thermoelectric conversion efficiency and responsiveness. Furthermore, the infrared-sensing portion can have a very small thickness, so that a heat conduction path is narrowed. Thus, adjacent infrared-sensing portions can be spaced apart at shorter intervals, which results in a greater packing density. Moreover, in a multi-element sensor including a plurality of infrared-sensing portions, the remaining substrate 3 located between adjacent infrared-sensing portions can function as a heat sink, thereby providing a small multi-element sensor that is not significantly influenced by crosstalk (see, for example, Japanese Unexamined Patent Application Publication No. 6-194226).

However, in such an infrared sensor, the pyroelectric substrate is in contact with the Si substrate, except at the infrared-sensing portion. This provides insufficient thermal insulation. Thus, the thermoelectric conversion efficiency and responsiveness are inadequate.

SUMMARY OF THE INVENTION

To overcome the problems described above, preferred embodiments of the present invention provide an infrared sensor having an infrared-sensing portion with improved thermal insulation and having satisfactory thermoelectric conversion efficiency and responsiveness, and a method for producing an infrared sensor having an infrared-sensing portion with sufficient thermal insulation.

Preferred embodiments of the present invention provide an infrared sensor including a first substrate made of a thermoelectric conversion material, a second substrate arranged to be spaced apart from the first substrate such that a main surface of the second substrate faces a main surface of the first substrate, a plurality of posts arranged to connect the first substrate and the second substrate and support the first substrate and the second substrate while the first substrate and the second substrate are spaced apart from one another, and a sensing electrode arranged on at least one main surface of the first substrate, the sensing electrode sensing infrared rays incident on the first substrate.

An infrared-sensing portion is preferably defined by the sensing electrode arranged on the first substrate made of the thermoelectric conversion material. The first substrate provided with the infrared-sensing portion is supported by the posts while being spaced apart from the second substrate, thereby ensuring thermal insulation between the infrared-sensing portion and the second substrate.

In the infrared sensor, an external terminal connection electrode to be connected to an external circuit may preferably be arranged on a main surface of the second substrate opposite the main surface facing the first substrate, and the sensing electrode may preferably be electrically connected to the posts and the external terminal connection electrode. In this case, the infrared sensor can preferably be mounted on a circuit board and connected to the external circuit using the external terminal connection electrode.

Alternatively, an interconnection electrode may preferably be arranged on a main surface of the second substrate opposite the main surface facing the first substrate, and the sensing electrode may preferably be electrically connected to the interconnection electrode. In this case, the infrared sensor can be mounted on a circuit board, and the interconnection electrode can be wire-bonded to an external circuit.

The posts may preferably be arranged to extend through at least one of the first substrate and the second substrate.

The second substrate may preferably be an IC substrate. In this case, a signal obtained by sensing infrared rays in the infrared-sensing portion can be treated in the second substrate.

Preferred embodiments of the present invention also provide an infrared sensor including a first substrate made of a thermoelectric conversion material, a sensing electrode arranged on at least one main surface of the first substrate, the sensing electrode sensing infrared rays incident on the first substrate, a second substrate bonded to the first substrate to support the first substrate, a cavity arranged in a portion of the second substrate substantially corresponding to a portion in which the sensing electrode is arranged, and a through slot arranged in the first substrate around the portion in which the sensing electrode is arranged.

The first substrate is preferably supported by the second substrate. The cavity is preferably arranged in the portion of the second substrate substantially corresponding to an infrared-sensing portion provided with the sensing electrode, thereby providing thermal insulation between the infrared-sensing portion and the second substrate. Furthermore, the through slot is preferably arranged in the first substrate and around the portion in which the sensing electrode is arranged, thereby providing thermal insulation between the infrared-sensing portion and a portion of the first substrate in contact with the second substrate.

In the infrared sensor, the cavity may preferably be arranged so as to extend through the second substrate. Alternatively, the cavity may preferably be defined by a recess located in a portion of the second substrate substantially corresponding to the portion in which the sensing electrode is arranged.

In the infrared sensors described above, an infrared-absorbing film may preferably be arranged so as to cover the sensing electrode. The absorption of infrared rays by the infrared-absorbing film results in satisfactory sensitivity.

Alternatively, a protective film may preferably be arranged so as to cover the sensing electrode, and an infrared-absorbing film may preferably be arranged on a portion of the protective film substantially corresponding to the portion in which the sensing electrode is arranged.

The surface of the infrared sensor is protected by the protective film. Furthermore, the absorption of infrared rays by the infrared-absorbing film results in satisfactory sensitivity.

The first substrate may be composed of a thermistor material or pyroelectric material, for example.

As the thermistor material, a $Mn_3O_4$-based material, $(Ba,Sr)TiO_3$-based material, or $(La,Ba)MnO_3$-based material, for example, may preferably be used. As the pyroelectric material, a $PbTiO_3$-based or $(Pb,Zr)TiO_3$-based material, for example, may preferably be used.

Furthermore, an infrared sensor array may be formed by arranging a plurality of the infrared sensors described above.

Preferred embodiments of the present invention also provide a method for producing an infrared sensor, the method including the steps of preparing a first substrate made of a thermoelectric conversion material, preparing a second substrate, bonding a main surface of the first substrate to a main surface of the second substrate using a binder, reducing the thickness of the first substrate, forming a sensing electrode on a main surface of the first substrate having a reduced thickness, the sensing electrode sensing infrared rays incident on the first substrate, forming a post extending through the binder to connect the first substrate to the second substrate, and removing the binder.

Since the first substrate is bonded to the second substrate, the thickness of the first substrate is easily reduced. After the thickness of the first substrate is reduced, the binder is removed. As a result, the first substrate is supported by the post while being spaced apart from the second substrate. That is, the first substrate having a reduced thickness is supported while being spaced apart from the second substrate. The sensing electrode is formed on the first substrate having a reduced thickness to form an infrared-sensing portion. Thereby, it is possible to produce an infrared sensor including an infrared-sensing portion that is thermally insulated from other portions and that has a low heat capacity.

In the method for producing an infrared sensor, the step of forming the post may preferably include a substep of forming a through hole that extends through the second substrate and the binder and that communicates with the first substrate, and a substep of forming an electrode in the through hole to form the post.

The post may preferably be formed so as to be connected to the sensing electrode, and the method may preferably further include a step of forming an external terminal connection electrode on a main surface of the second substrate opposite the main surface facing the first substrate, the external terminal connection electrode being connected to the post. In this case, it is possible to provide an infrared sensor that can be mounted on a circuit board and connected to an external circuit with the external terminal connection electrode.

Alternatively, the step of forming the post may preferably include a substep of forming a through hole that extends through the first substrate and the binder and that communicates with the second substrate, and a substep of forming an electrode in the through hole to form the post.

In this case, the method may preferably further include the steps of forming an interconnection electrode on the main surface of the second substrate facing the first substrate before bonding the first substrate to the second substrate, and connecting the post to the interconnection electrode when forming the post, so that the sensing electrode is connected to the post and the interconnection electrode. It is possible to provide an infrared sensor including the interconnection electrode on the second substrate by the production method, the interconnection electrode being arranged to be connected to the external circuit by wire bonding.

Furthermore, in the production method in which the post extending through the first substrate and the binder is connected to the interconnection electrode, the method may preferably further include the steps of forming a through hole extending through the second substrate and communicating with the interconnection electrode after forming the post, forming an electrode in the through hole extending through the second substrate, and forming an external terminal connection electrode on a main surface of the second substrate opposite the surface facing the first substrate, the external terminal connection electrode being connected to the post. In this case, the interconnection electrode is used as a relay between the post connected to the sensing electrode defining the infrared-sensing portion and the external terminal connection electrode.

In the production method in which the post extending through the first substrate and the binder is formed, the second substrate may preferably be an IC substrate, and the sensing electrode may preferably be connected to a circuit arranged on the second substrate through the post.

It is possible to provide an infrared sensor capable of treating a signal sent from the infrared-sensing portion in a circuit arranged on the second substrate with this production method.

The step of removing the binder is preferably performed by isotropic etching, for example. Removal of the bonding layer by isotropic etching prevents partial under- and over-etching during the etching and reduces damage due to etching to a portion other than the binder.

Preferred embodiments of the present invention also provide a method for producing an infrared sensor, the method including the steps of preparing a first substrate made of a thermoelectric conversion material, preparing a second substrate, forming a first interconnection electrode on a main surface of the first substrate, forming a second interconnection electrode on a main surface of the second substrate, bonding the first interconnection electrode to the second interconnection electrode to form a post that enables stacking of the first substrate and the second substrate so as to face each other, reducing the thickness of the first substrate, and forming a sensing electrode on a main surface of the first substrate, the sensing electrode sensing infrared rays incident on the first substrate.

The interconnection electrodes formed on the first substrate and the second substrate are bonded to form the post. Thus, the first substrate is supported by the post while being spaced apart from the second substrate.

The method for producing an infrared sensor may preferably further include the steps of forming a through hole in the first substrate after forming the sensing electrode, the through hole communicating with the sensing electrode and the first interconnection electrode, forming an electrode in the through hole arranged in the first substrate to connect the sensing electrode to the first interconnection electrode, forming a through hole in the second substrate, the through hole communicating with the second interconnection electrode, forming an electrode in the through hole arranged in the second substrate, and forming an external terminal connection electrode on a main surface of the second substrate opposite the main surface facing the first substrate such that the external terminal connection electrode is connected to the electrode arranged in the through hole in the second substrate, the external terminal connection electrode being arranged to be connected to an external circuit.

The sensing electrode formed on the first substrate is preferably connected to the external terminal connection electrode formed on the second substrate. Thus, the infrared sensor can be mounted on a circuit board and connected to the external circuit using the external terminal connection electrode.

Any of the foregoing methods for producing an infrared sensor according to preferred embodiments of the present invention may preferably further include the steps of forming a groove in the first substrate and around the sensing electrode, and removing a portion of the first substrate located outside the groove arranged around the sensing electrode.

Since the portion of the first substrate located outside the groove arranged around the sensing electrode is removed, the first substrate is smaller than the second substrate. This results in an increased space between the first substrate and an element adjacent to the first substrate when the infrared sensor is mounted on a circuit board, for example, thereby providing satisfactory thermal insulation between the first substrate provided with the infrared-sensing portion and the element adjacent to the first substrate and preventing crosstalk due to thermal conduction.

Preferred embodiments of the present invention also provide a method for producing an infrared sensor, the method including the steps of, preparing a first substrate made of a thermoelectric conversion material, preparing a second substrate, forming a through hole in the second substrate, bonding a main surface of the first substrate to a main surface of the second substrate having the through hole, reducing the thickness of the first substrate, forming a sensing electrode on a portion of a main surface of the first substrate substantially corresponding to the through hole, the sensing electrode sensing infrared rays incident on the first substrate, and forming a through slot in the first substrate and around the sensing electrode.

After the first substrate is bonded to the second substrate having the through hole and the thickness thereof is reduced, the through slot is formed in the first substrate and around the sensing electrode. Thus, an infrared-sensing portion provided with the sensing electrode is located on the thin first substrate surrounded by the through slot. The infrared-sensing portion is spaced apart from the second substrate by a cavity and thermally insulated from the periphery thereof by the through slot. Therefore, it is possible to produce an infrared sensor including an infrared-sensing portion thermally insulated from other portions and having a low heat capacity.

Preferred embodiments of the present invention also provide a method for producing an infrared sensor, the method including the steps of preparing a first substrate made of a thermoelectric conversion material, preparing a second substrate, forming a recess in a main surface of the second substrate, bonding a main surface of the first substrate to the main surface of the second substrate having the recess, reducing the thickness of the first substrate, forming a sensing electrode on a portion of a main surface of the first substrate substantially corresponding to the recess, the sensing electrode sensing infrared rays incident on the first substrate, and forming a through slot in the first substrate and around the sensing electrode.

The cavity arranged to separate the infrared-sensing portion from the second substrate may also preferably be formed by forming a recess in the second substrate.

Preferred embodiments of the present invention also provide a method for producing an infrared sensor, the method including the steps of preparing a first substrate made of a thermoelectric conversion material, preparing a second substrate, bonding a first main surface of the first substrate to a main surface of the second substrate, reducing the thickness of the first substrate, forming a sensing electrode on a second main surface of the first substrate, the sensing electrode sensing infrared rays incident on the first substrate, forming a through hole in a portion of the second substrate substantially corresponding to the sensing electrode to form a cavity on the first main surface side of the first substrate, and forming a through hole in the first substrate and around the sensing electrode.

The through hole arranged in the second substrate forming the cavity may preferably be formed after the first substrate is bonded to the second substrate.

Any of the methods for producing an infrared sensor according to preferred embodiments of the present invention may preferably further include a step of forming an infrared-absorbing film such that the infrared-absorbing film covers the sensing electrode. Alternatively, any of the methods according to preferred embodiments of the present invention may preferably further include the steps of forming a protective film such that the protective film covers the sensing electrode, and forming an infrared-absorbing film on a portion of the protective film substantially corresponding to a portion in which the sensing electrode is arranged. The formation of the protective film protects the surface of the first substrate provided with the sensing electrode. The formation of the infrared-absorbing film produces in satisfactory sensitivity.

According to preferred embodiments of the present invention, it is possible to obtain an infrared sensor including an infrared-sensing portion that is thermally insulated from other portions and that has satisfactory thermoelectric conversion efficiency and responsiveness.

It is also possible to efficiently produce an infrared sensor having an infrared-sensing portion that is thermally insulated from other portions by a production method according to preferred embodiments of the present invention.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 10 is an illustrative view of an infrared sensor according to a preferred embodiment of the present invention.

FIGS. 16A to 16I are illustrative views of a method for producing the infrared sensor shown in FIG. 12.

DETAILED DESCRIPTION OF PREFERRED EMBODIMENTS

Figure 1:
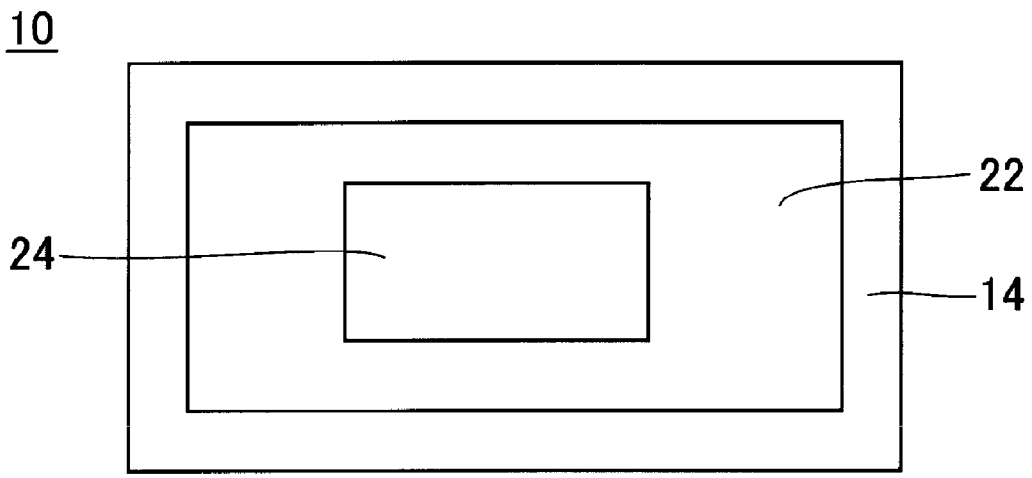
FIG. 1 is a plan view of an infrared sensor according to a preferred embodiment of the present invention.
Figure 2:
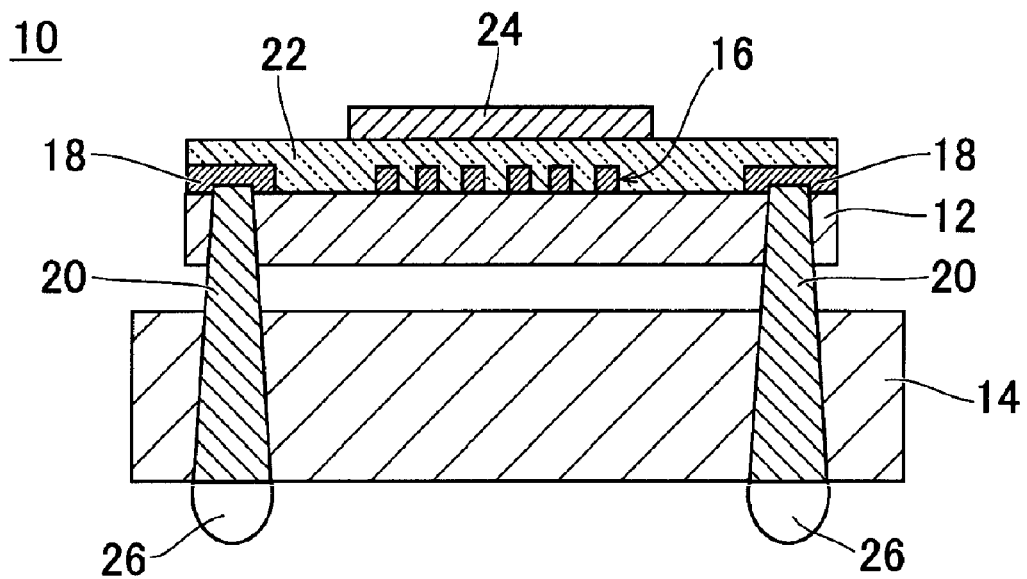
FIG. 2 is a cross-sectional view illustrating the infrared sensor shown in FIG. 1.
Figure 3:
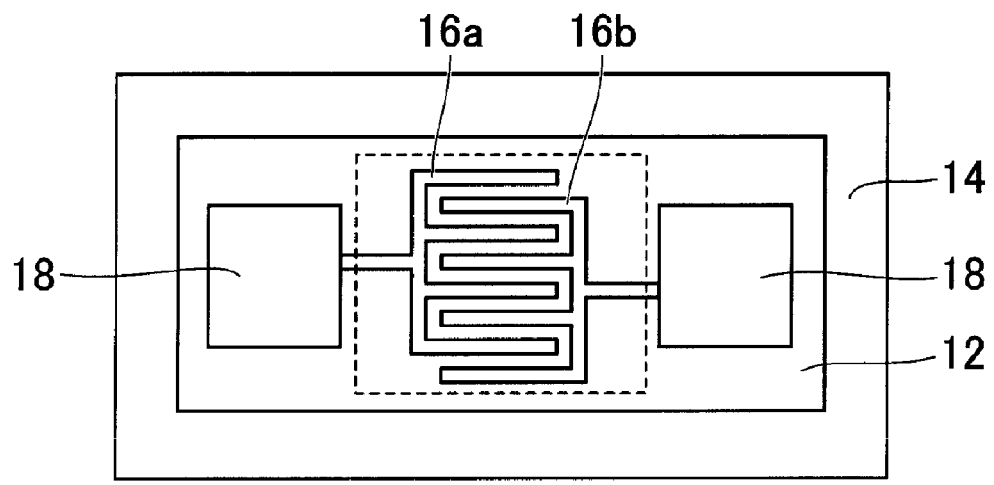
FIG. 3 is an illustrative view of an exemplary sensing electrode provided in the infrared sensor shown in FIG. 1.

FIG. 1 is a plan view of an infrared sensor according to a preferred embodiment of the present invention. FIG. 2 is a cross-sectional view illustrating the infrared sensor. An infrared sensor 10 includes a first substrate 12 and a second substrate 14. The first substrate 12 is made of a thermoelectric conversion material, such as a thermistor material or a pyroelectric material, for example, and has a relatively small thickness. Examples of a thermistor material that can preferably be used include $Mn_3O_4$-based materials, $(Ba,Sr)TiO_3$-based materials, and $(La,Ba)MnO_3$-based materials. Examples of a pyroelectric material that can preferably be used include $PbTiO_3$-based and $(Pb,Zr)TiO_3$-based materials. The second substrate 14 is preferably made of Si, for example. When the first substrate 12 is made of a thermistor material, a sensing electrode 16 is provided on one main surface of the first substrate 12. The sensing electrode 16 is preferably defined by interdigitally arranging two comb-shaped electrode segments 16a and 16b as shown in the plan view of FIG. 3. The comb-shaped electrode segments 16a and 16b extend in opposite directions and are connected to respective lead portions 18. The sensing electrode 16 and the lead portions 18 are preferably made of, for example, Al/Ti or Al/NiCr. An infrared-sensing portion is provided on a portion in which the sensing electrode 16 is arranged. When the first substrate 12 is made of a pyroelectric material, the sensing electrode 16 is arranged such that the electrode segments are oppositely arranged on both surfaces of the first substrate 12.

The first substrate 12 is supported by two posts 20 while being space apart from the second substrate 14. The posts 20 are preferably made of, for example, an electrode material. The posts 20 pass through the first substrate 12 and the second substrate 14 and are connected to the lead portions 18 of the sensing electrode 16. The first substrate 12 is smaller than the second substrate 14. Thus, the first substrate 12 is arranged inside the second substrate 14 when viewed from above the first substrate 12.

Figure 4:
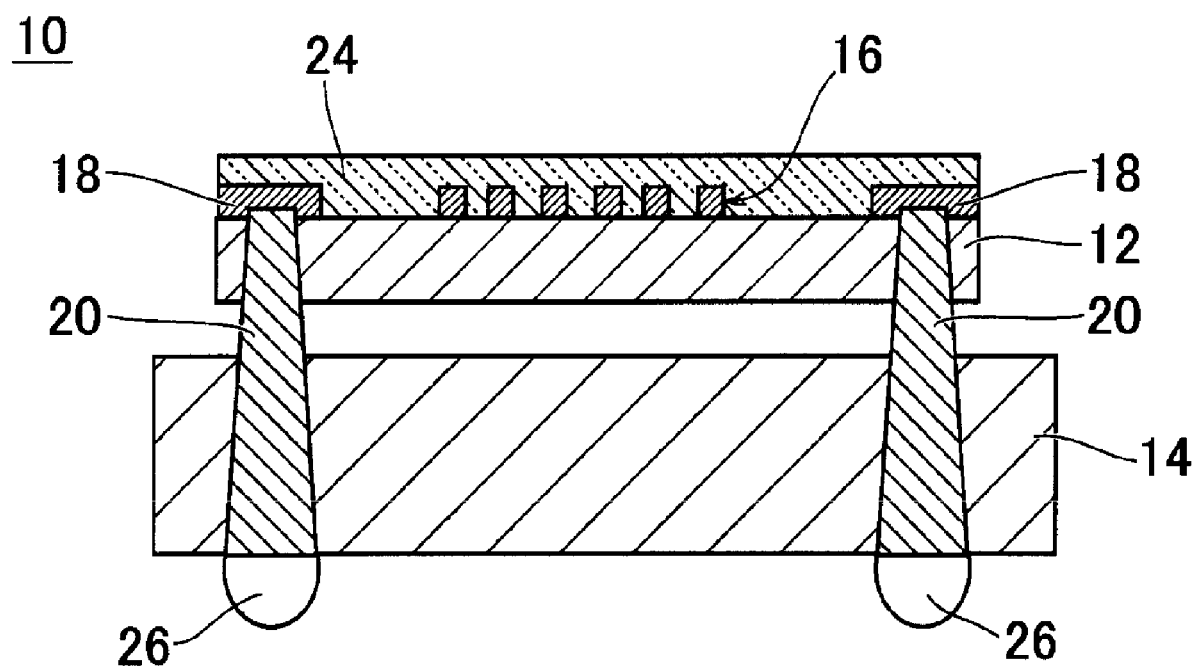
FIG. 4 is a cross-sectional view illustrating an infrared sensor according to another preferred embodiment of the present invention.

A protective film 22 is arranged on the first substrate 12 so as to cover the sensing electrode 16. The protective film 22 is preferably made of an insulating material, such as $SiO_2$ or $Al_2O_3$, for example. An infrared-absorbing film 24 is arranged on a portion of the protective film 22 substantially corresponding to the portion in which the sensing electrode 16 is arranged. The infrared-absorbing film 24 is preferably made of, for example, Au black, NiCr, or TiN, for example. External terminal connection electrodes 26 are arranged on a main surface of the second substrate 14 opposite the main surface facing the first substrate 12. The external terminal connection electrodes 26 are connected to the two posts 20. Thus, the external terminal connection electrodes 26 are connected to the segments of the sensing electrode 16 through the posts 20. FIG. 4 is a cross-sectional view illustrating an infrared sensor according to another preferred embodiment of the present invention. In this preferred embodiment, the infrared-absorbing film 24 is arranged so as to cover the sensing electrode 16. The infrared-absorbing film 24 may absorb infrared rays and protect the sensing electrode 16.

The infrared sensor 10 is mounted on a circuit board or other suitable electronic component. The external terminal connection electrodes 26 are connected to terminals arranged on the circuit board. The infrared-absorbing film 24 absorbs incident infrared rays to change the temperature of the first substrate 12, thus resulting in a change in the resistance between the comb-shaped electrode segments 16a and 16b. A change in temperature can be detected by the change in resistance. A signal corresponding to the change in temperature is transmitted to an external circuit through the posts 20 and the external terminal connection electrodes 26.

Figure 5A:
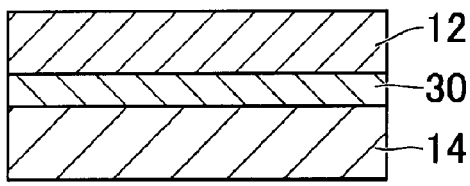
FIGS. 5A to 5J are illustrative views of a method for producing the infrared sensor shown in FIG. 1.
Figure 5B:
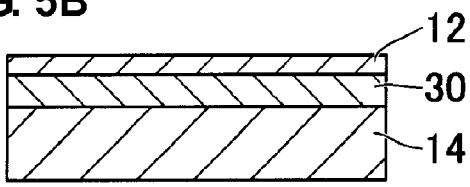

FIGS. 5A to 5J show a method for producing the infrared sensor 10. As shown in FIG. 5A, the bulk first substrate 12 is bonded to the bulk second substrate 14 with a binder 30 made of a resin material, such as a polyimide resin or an epoxy resin, for example. As shown in FIG. 5B, the first substrate 12 is reduced in thickness by polishing such as lapping or in-feed grinding, for example, to have a desired thickness (preferably about 50 μm or less, for example).

Figure 5C:
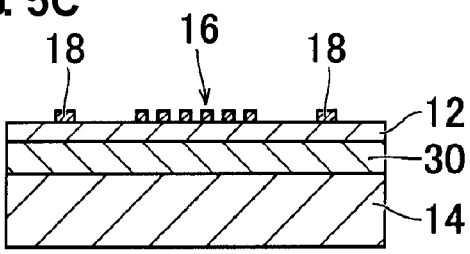
Figure 5D:
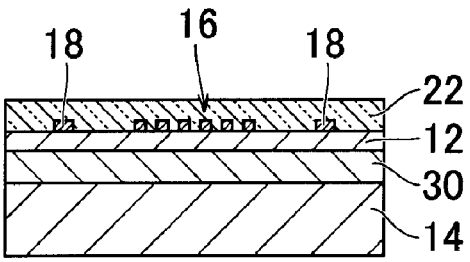
Figure 5E:
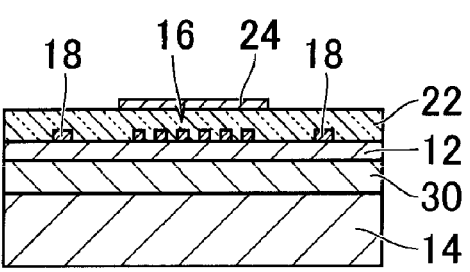

As shown in FIG. 5C, the comb-shaped electrode segments 16a and 16b are formed on the first substrate 12, thus forming the sensing electrode 16. At this time, the lead portions 18 are simultaneously formed. FIG. 4 shows one sensing electrode 16. In practice, large-sized substrates 12 and 14 are used. A plurality of sensing electrodes 16 are formed on one first substrate 12. Infrared-sensing portions are formed on portions in which the sensing electrodes 16 are arranged. As shown in FIG. 5D, the protective film 22 made of, for example, $SiO_2$ or $Al_2O_3$ is formed on the first substrate 12 so as to cover the sensing electrode 16 and the lead portions 18. As shown in FIG. 5E, the infrared-absorbing film 24 is formed on a portion of the protective film 22 substantially corresponding to the portion in which the sensing electrode 16 is arranged.

Figure 5F:
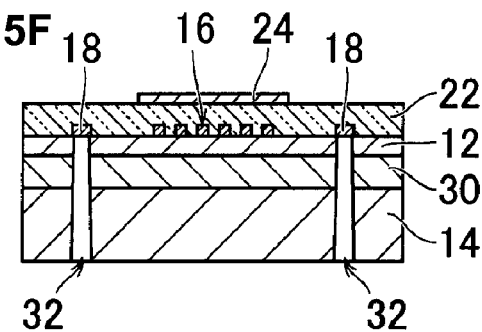
Figure 5G:
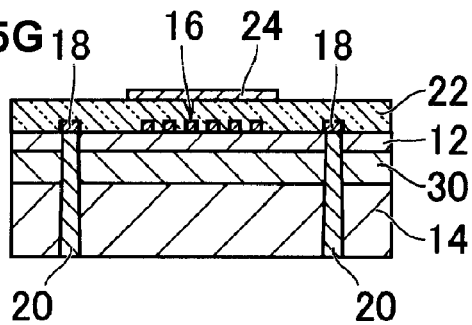
Figure 5H:
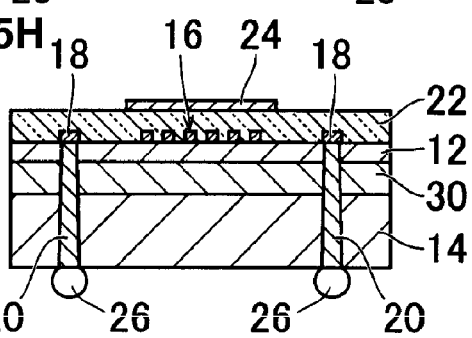

As shown in FIG. 5F, through holes 32 are formed through the second substrate 14 and the binder 30 so as to communicate with the lead portions 18 of the sensing electrode 16. The through holes 32 are preferably formed by irradiating the second substrate 14 with a laser from a side of the second substrate 14 opposite the side facing the first substrate 12 or a method, such as RIE or sand blasting, for example. As shown in FIG. 5G, electrodes are formed in the through holes 32 by plating or other suitable method, thereby forming the posts 20. As shown in FIG. 5H, the external terminal connection electrodes 26 are formed on the second substrate 14 so as to be connected to the posts 20. Therefore, the external terminal connection electrodes 26 are connected to the segments of the sensing electrode 16 through the posts 20.

Figure 5I:
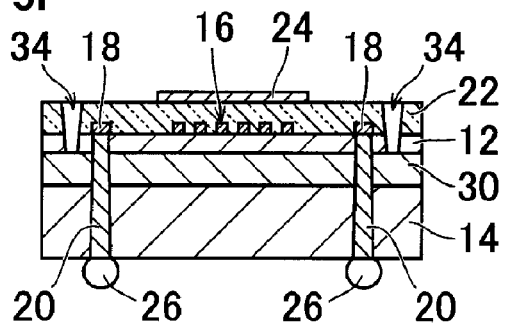
Figure 5J:
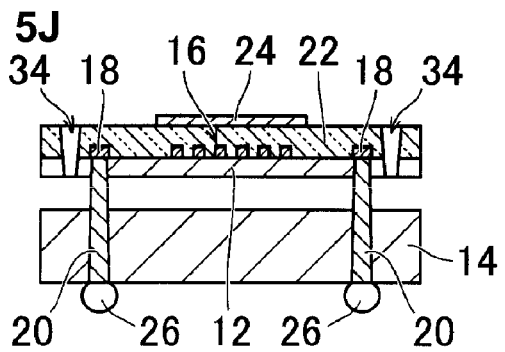

As shown in FIG. 5I, a groove 34 extending through the first substrate 12 and the protective film 22 is formed so as to surround the sensing electrode 16. As shown in FIG. 5J, the binder 30 is removed by etching or other suitable method. Removal of the binder 30 by isotropic etching can prevent partial under- and over-etching during the etching and reduce damage caused by etching to a portion other than the binder 30. As a result, the first substrate 12 and the second substrate 14 are supported by the posts 20 while being spaced apart from each other. The groove 34 is arranged around the portion in which the sensing electrode 16 is arranged. Thus, the first substrate 12 and the protective film 22 located between adjacent sensing electrodes 16 are not supported after the removal of the binder 30. This portion is removed to form a gap between adjacent infrared-sensing portions. The second substrate 14 is cut along the gap into individual infrared sensors 10.

The first substrate 12 is bonded to the second substrate 14 with the binder 30. Thus, the thickness of the bulk first substrate 12 can preferably be reduced to about 50 μm or less, for example. Furthermore, in the resulting infrared sensor 10, the first substrate 12 and the second substrate 14 are connected using only the two posts 20, which produce a small contact area between the first substrate 12 and the second substrate 14. This results in a low heat capacity of the first substrate 12, sufficient thermal insulation, and improved thermoelectric efficiency and responsiveness. Moreover, the first substrate 12 being smaller than the second substrate 14 results in an increased space between the infrared-sensing portion and an element adjacent to the infrared-sensing portion when the infrared sensor 10 is mounted on a circuit board, thereby preventing crosstalk due to thermal conduction and forming a thermal isolation structure at a low cost.

In the production method, a Pb-free resin material is preferably used as the binder 30 that bonds the first substrate 12 and the second substrate 14, which eliminates the use of an environmental impact material. The infrared sensor 10 produced by the production method includes the external terminal connection electrodes 26 on the surface of the second substrate 14, and thus, can be surface-mounted on a circuit board, for example, thereby reducing the mounting area. In FIG. 5D, the infrared-absorbing film 24 may be provided instead of the protective film 22 to eliminate the step shown in FIG. 5E.

Figure 6A:
FIGS. 6A to 6K are illustrative views of a method for producing an infrared sensor having a structure different from that of the infrared sensor shown in FIG. 1.
Figure 6B:
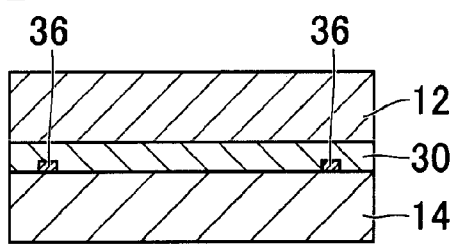
Figure 6C:
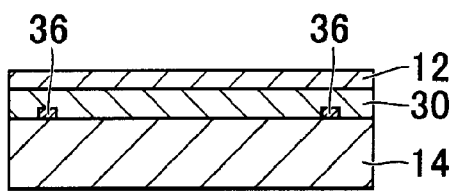
Figure 6D:
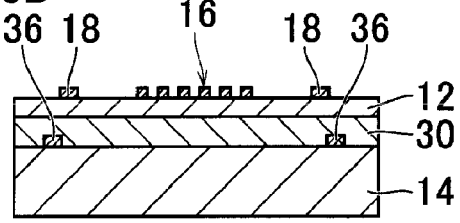

FIGS. 6A to 6K are illustrative views of another method for producing an infrared sensor according to preferred embodiments of the present invention. In this production method, as shown in FIG. 6A, two interconnecting electrodes 36 are formed on a main surface of the second substrate 14 so as to be spaced apart from each other. As shown in FIG. 6B, the bulk first substrate 12 is bonded to the main surface of the second substrate 14 provided with the interconnecting electrodes 36 using the binder 30. As shown in FIG. 6C, the thickness of the first substrate 12 is reduced. As shown in FIG. 6D, the sensing electrode 16 and the lead portions 18 are formed on the first substrate 12 having a reduced thickness. At this point, the lead portions 18 of the sensing electrode 16 are arranged at locations substantially corresponding to the interconnecting electrodes 36.

Figure 6E:
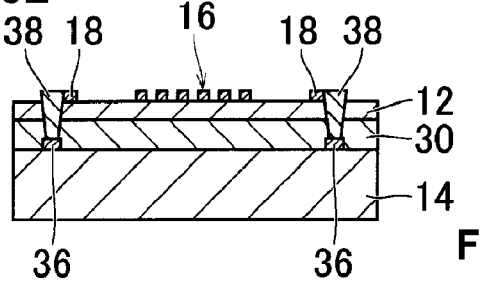

As shown in FIG. 6E, through holes communicating with the interconnecting electrodes 36 are formed through the first substrate 12 and the binder 30. Electrodes are formed therein by plating to form posts 38. In this case, the lead portions 18 are arranged at locations substantially corresponding to the interconnecting electrodes 36. Thus, the through holes communicating with the interconnecting electrodes 36 are formed so as to partially remove the lead portions 18. By forming the electrodes in the through holes, the posts 38 are connected to the lead portions 18, so that the segments of the sensing electrode 16 are electrically connected to the interconnecting electrodes 36. Alternatively, through holes may be formed in peripheries of the lead portions 18. In this case, when electrodes are formed in the through holes, the electrodes in the through holes may be connected to the lead portions 18.

Figure 6F:
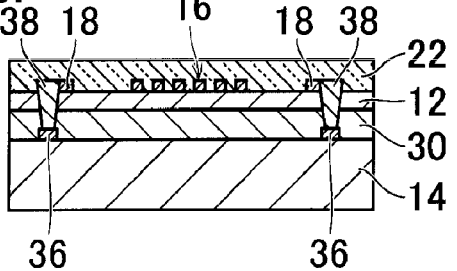
Figure 6G:
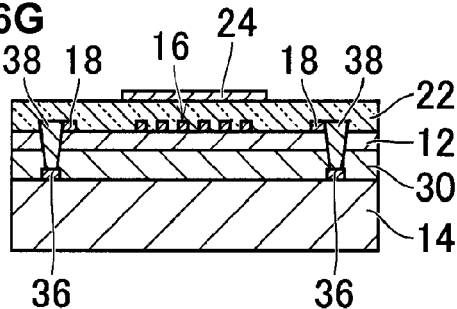
Figure 6H:
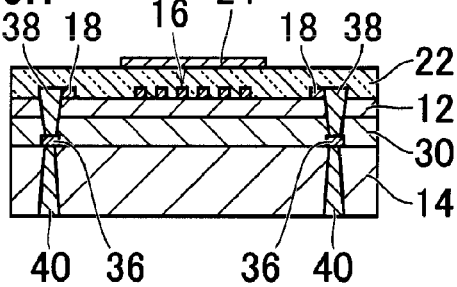
Figure 6I:
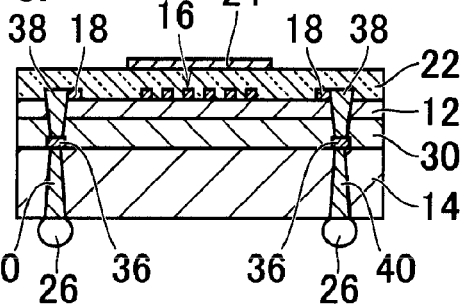

After the formation of the posts 38, as shown in FIG. 6F, the protective film 22 is formed on the first substrate 12 so as to cover the sensing electrode 16. As shown in FIG. 6G, the infrared-absorbing film 24 is formed on a portion of the protective film 22 substantially corresponding to the sensing electrode 16. As shown in FIG. 6H, through holes communicating with the interconnecting electrodes 36 are formed through the second substrate 14. Electrodes 40 are formed in the through holes by plating or other suitable method. As shown in FIG. 6I, the external terminal connection electrodes 26 are formed on a main surface of the second substrate 14 so as to be connected to the electrodes 40. In FIG. 6F, the infrared-absorbing film 24 is formed instead of the protective film 22 to eliminate the step shown in FIG. 6G.

Figure 6J:
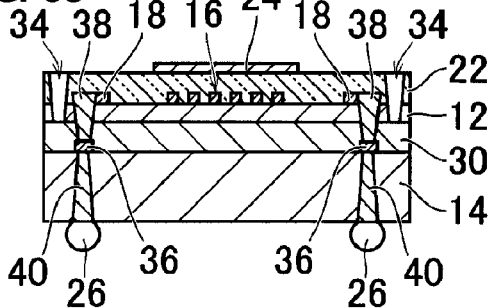
Figure 6K:
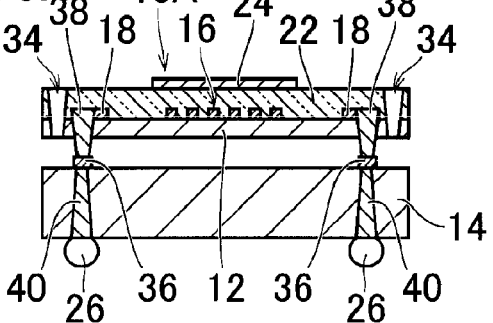

As shown in FIG. 6J, the groove 34 extending through the protective film 22 and the first substrate 12 is formed so as to surround the sensing electrode 16. As shown in FIG. 6K, the binder 30 is removed by etching or other suitable method to separate the first substrate 12 from the second substrate 14, so that the first substrate 12 is supported by the posts 38. Portions of the protective film 22 and the first substrate 12 located outside the groove 34 and between adjacent sensing electrodes 16 are removed. Then, the second substrate 14 is cut at locations between adjacent sensing electrodes 16 into individual infrared sensors 10A. In each of the infrared sensors 10A, the posts 38 are formed from the first substrate 12, and the first substrate 12 is supported by the posts 38 while being spaced apart from the second substrate 14.

Figure 7A:
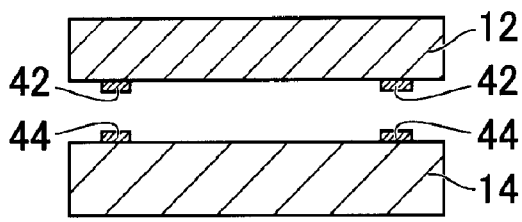
FIGS. 7A to 7J are illustrative views of a method for producing an infrared sensor having another structure different from that of the infrared sensor shown in FIG. 1.

As shown in FIGS. 7A to 7J, the infrared sensor 10 can be formed without using a binder. In this case, as shown in FIG. 7A, first interconnection electrodes 42 are formed on the bulk first substrate 12. Second interconnection electrodes 44 are formed on the second substrate 14. The first interconnection electrodes 42 and corresponding ones of the second interconnection electrodes 44 are located at corresponding locations when the first substrate 12 and the second substrate 14 are superimposed so that main surfaces thereof face each other. The first interconnection electrodes 42 and the second interconnection electrodes 44 are preferably made of materials, such as Ga, In, Sn, Cu, Au, and Ni, for example. Alternatively, the first and second interconnection electrodes 42 and 44 are formed of laminates including these materials. Preferably, the first interconnection electrodes 42 and the second interconnection electrodes 44 are formed such that a first metal made of at least one selected from Ga, In, and Sn and a second metal made of at least one selected from Ni, Au, and Cu are arranged in contact with each other when the first interconnection electrodes 42 and the second interconnection electrodes 44 are bonded.

Figure 7F:
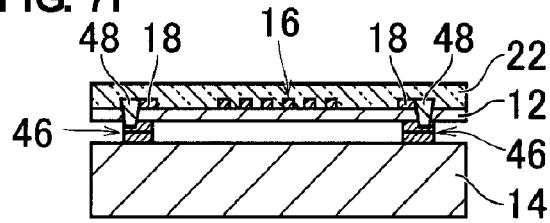
Figure 7B:
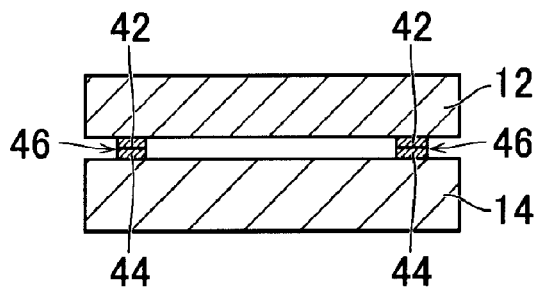

As shown in FIG. 7B, the first substrate 12 and the second substrate 14 are superimposed and the first interconnection electrodes 42 and the second interconnection electrodes 44 are bonded. The first interconnection electrodes 42 and the second interconnection electrodes 44 are bonded by, for example, heating while these interconnection electrodes 42 and 44 are pressed against each other. Heating produces the formation of an alloy layer including the first metal and the second metal at the interface between the first interconnection electrodes 42 and the second interconnection electrodes 44. The alloy layer bonds the interconnection electrodes 42 and 44. The first interconnection electrodes 42 is bonded to the second interconnection electrodes 44 to form posts 46 that support the first substrate 12 while the first substrate 12 is spaced apart from the second substrate 14.

Figure 7G:
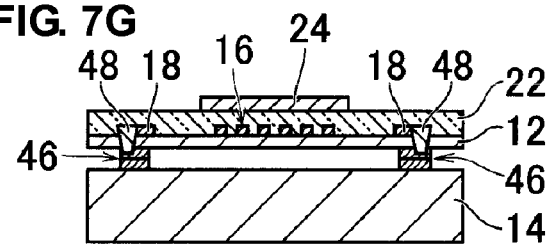
Figure 7C:
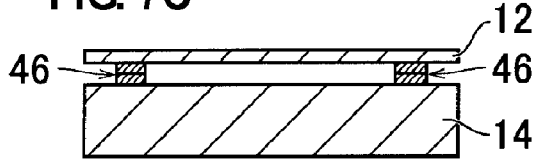
Figure 7H:
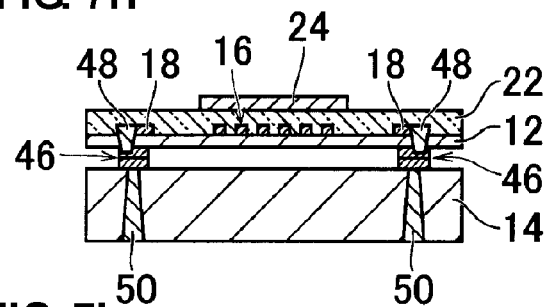
Figure 7D:
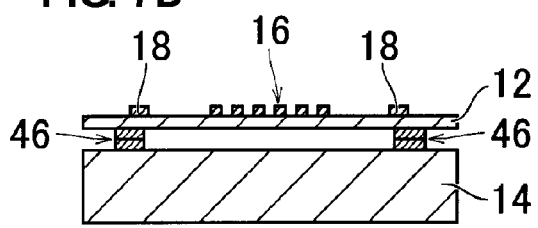
Figure 7I:
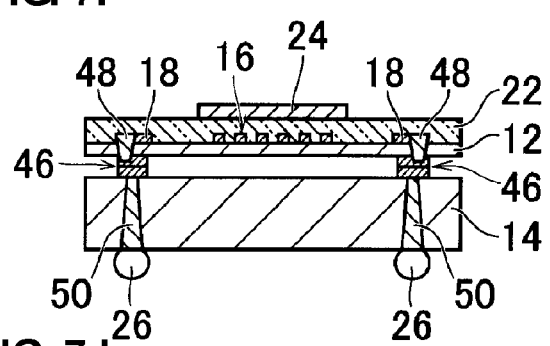
Figure 7E:
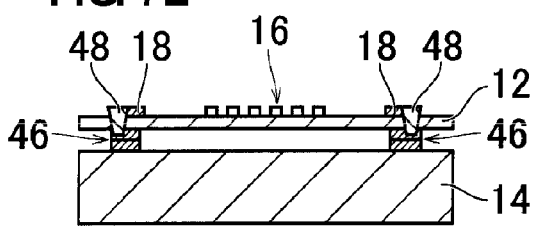

As shown in FIG. 7C, the thickness of the first substrate 12 is reduced. As shown in FIG. 7D, the sensing electrode 16 is formed on the first substrate 12. The lead portions 18 of the sensing electrode 16 are formed at locations substantially corresponding to the posts 46. As shown in FIG. 7E, through holes communicating with the posts 46 are formed through the first substrate 12. Electrodes 48 are formed in the through holes by plating or other suitable method. The lead portions 18 of the sensing electrode 16 are electrically connected to the posts 46 through the electrodes 48. Alternatively, through holes may be formed in peripheries of the lead portions 18. In this case, when electrodes are formed in the through holes, the electrodes in the through holes may be connected to the lead portions 18.

As shown in FIG. 7F, the protective film 22 is arranged on the first substrate 12 so as to cover the sensing electrode 16. As shown in FIG. 7G, the infrared-absorbing film 24 is formed on the protective film 22. As shown in FIG. 7H, through holes communicating with the posts 46 are formed through the second substrate 14. Electrodes 50 are formed in the through holes by plating or other suitable method. As shown in FIG. 7I, the external terminal connection electrodes 26 are formed on a main surface of the second substrate 14 so as to be connected to the electrodes 50. In FIG. 7F, the infrared-absorbing film 24 may be formed instead of the protective film 22 to eliminate the step shown in FIG. 7G.

Figure 7J:
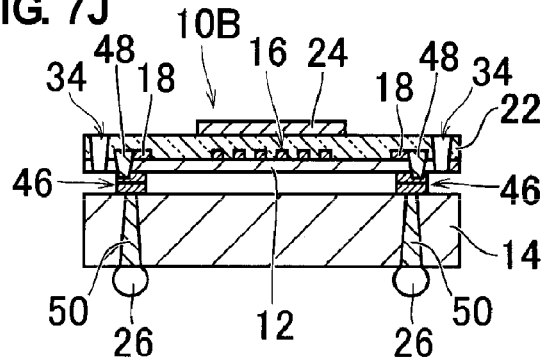

As shown in FIG. 7J, the groove 34 extending through the protective film 22 and the first substrate 12 is formed so as to surround the sensing electrode 16. Portions of the protective film 22 and the first substrate 12 located outside the groove 34 and between adjacent sensing electrodes 16 are removed. Then the second substrate 14 is cut at locations between adjacent sensing electrodes 16 into individual infrared sensors 10B. The use of the method for producing the infrared sensors 10B enables the elimination of the step of removing a bonding layer.

Figure 8A:
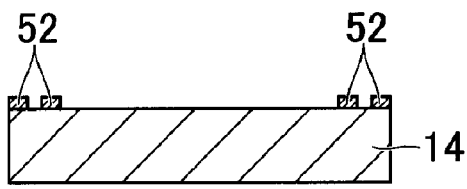
FIGS. 8A to 8I are illustrative views of a method for producing an infrared sensor having another structure different from that of the infrared sensor shown in FIG. 1.

As shown in FIGS. 8A to 8I, the infrared sensor 10 having electrodes for wire bonding can also be produced. In this case, as shown in FIG. 8A, interconnection electrodes 52 are formed at locations spaced apart from each other on a main surface of the second substrate 14. The interconnection electrodes 52 are located at the locations substantially corresponding to lead portions of a sensing electrode to be formed on the first substrate 12 and extend in opposite directions. That is, while FIG. 8A shows two interconnection electrodes arranged on each end of the second substrate 14, the two interconnection electrodes arranged on each end are routed and connected to each other on the second substrate 14.

Figure 8B:
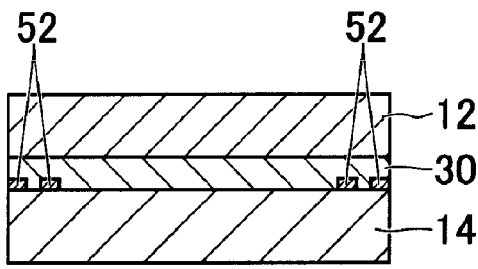
Figure 8C:
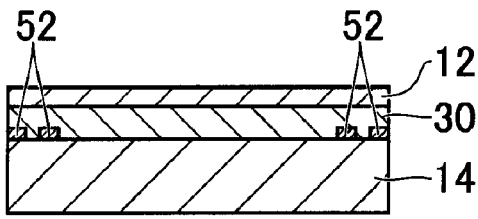
Figure 8D:
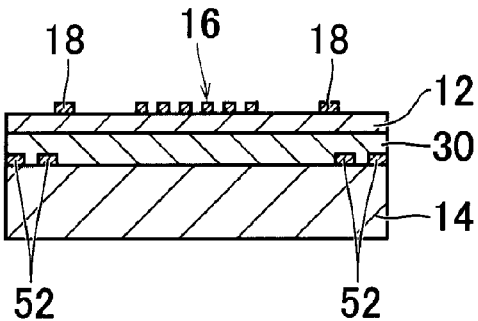

As shown in FIG. 8B, the bulk first substrate 12 is bonded to the second substrate 14 with the binder 30 provided therebetween so as to cover the interconnection electrodes 52. As shown in FIG. 8C, the thickness of the first substrate 12 is reduced. As shown in FIG. 8D, the sensing electrode 16 and the lead portions 18 are formed on the first substrate 12 having a reduced thickness. In this case, the lead portions 18 of the sensing electrode 16 are located at locations substantially corresponding to inner portions of the interconnection electrodes 52 arranged to be spaced apart from each other.

Figure 8E:
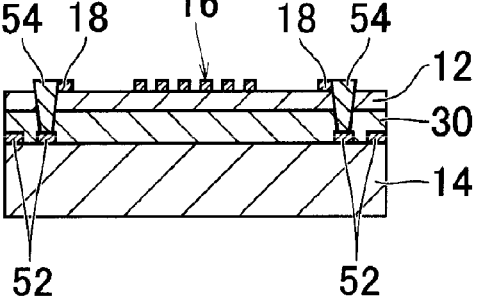

As shown in FIG. 8E, through holes communicating with the inner portions of the interconnection electrodes 52 are formed through the first substrate 12 and the binder 30. Electrodes are formed in the through holes to form posts 54. In this case, the lead portions 18 of the sensing electrode 16 are located at the locations substantially corresponding to the inner portions of the interconnection electrodes 52. Thus, the sensing electrode 16 is electrically connected to the interconnection electrodes 52 through the posts 54. Alternatively, through holes may be formed in peripheries of the lead portions 18. In this case, when electrodes are formed in the through holes, the electrodes may be connected to the lead portions 18.

Figure 8F:
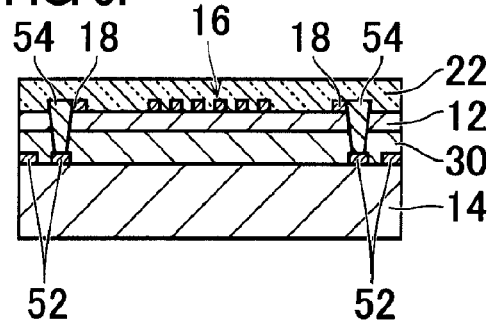
Figure 8G:
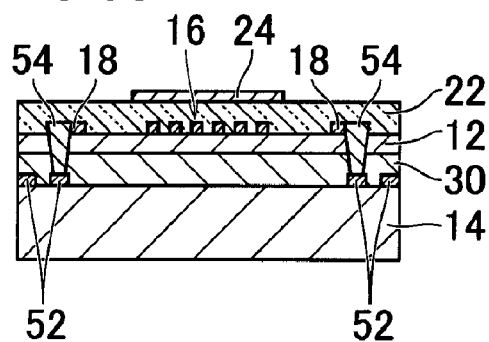
Figure 8H:
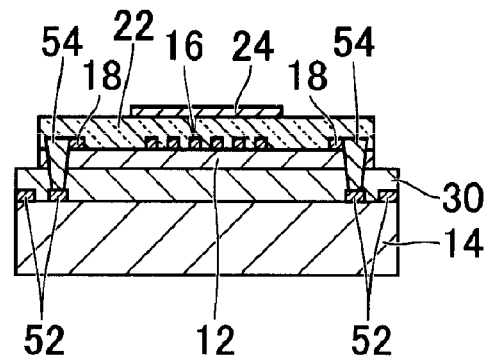
Figure 8I:
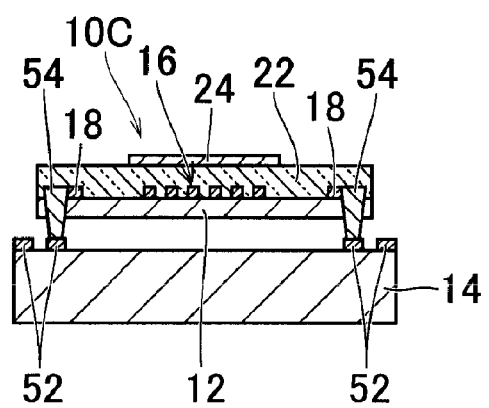

As shown in FIG. 8F, the protective film 22 is formed on the first substrate 12 so as to cover the sensing electrode 16. As shown in FIG. 8G, the infrared-absorbing film 24 is formed on the protective film 22. As shown in FIG. 8H, a groove extending through the protective film 22 and the first substrate 12 is formed so as to surround the sensing electrode 16. Portions of the protective film 22 and the first substrate 12 located outside the groove and between adjacent sensing electrodes 16 are removed. As shown in FIG. 8I, the binder 30 is removed by etching or other suitable method. Thus, outer portions of the interconnection electrodes 52 are exposed on the second substrate 14. Alternatively, in FIG. 8F, the infrared-absorbing film 24 may be formed instead of the protective film 22 to eliminate the step shown in FIG. 8G.

In this production method, the second substrate 14 is cut at locations between adjacent sensing electrodes 16 into individual infrared sensors 10C. Portions of the protective film 22 and the first substrate 12 located outside the groove have been removed. Thus, the first substrate 12 is smaller than the second substrate 14. As a result, the outer portions of the interconnection electrodes 52 are exposed when viewed from outside. Thus, the outer portions of the interconnection electrodes 52 can be used as wire bonding electrodes. In other words, after the infrared sensor 10C is mounted on a circuit board, the outer portions of the interconnection electrodes 52 can be connected to terminals on the circuit board by wire bonding.

Figure 9A:
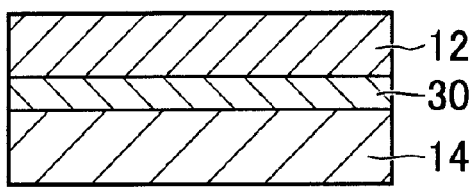
FIGS. 9A to 9H are illustrative views of a method for producing an infrared sensor having another structure different from that of the infrared sensor shown in FIG. 1.
Figure 9B:
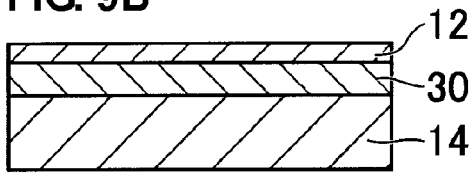
Figure 9C:
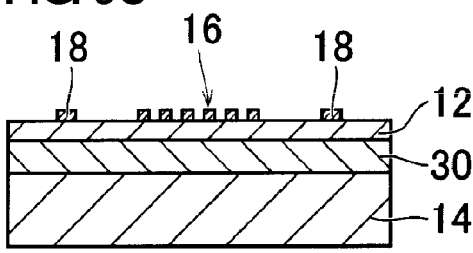

As shown in FIGS. 9A to 9H, an IC substrate may be used as the second substrate 14. In this case, as shown in FIG. 9A, the bulk first substrate 12 is bonded to the second substrate 14 defining the IC substrate using the binder 30. As shown in FIG. 9B, the thickness of the first substrate 12 is reduced. As shown in FIG. 9C, the sensing electrode 16 and the lead portions 18 are formed on the first substrate 12. The lead portions 18 of the sensing electrode 16 are located at locations substantially corresponding to external terminals (not shown) of the IC substrate serving as the second substrate 14.

Figure 9D:
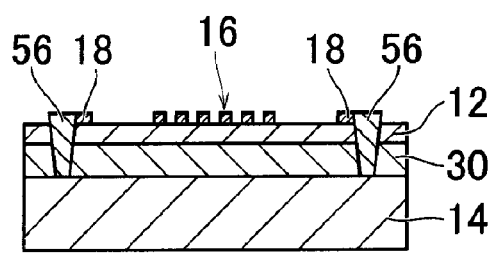

As shown in FIG. 9D, through holes communicating with the external terminals on the second substrate 14 are formed through the first substrate 12 and the binder 30. Electrodes are formed in the through holes by plating or other method to form posts 56. The lead portions 18 of the sensing electrode 16 are located at locations substantially corresponding to the external terminals on the second substrate 14. Thus, the lead portions 18 of the sensing electrode 16 are electrically connected to the external terminals on the second substrate 14 through the posts 56. Alternatively, through holes may be peripheries in the lead portions 18. In this case, when electrodes are formed in the through holes, the electrodes in the through holes may be connected to the lead portions 18.

Figure 9E:
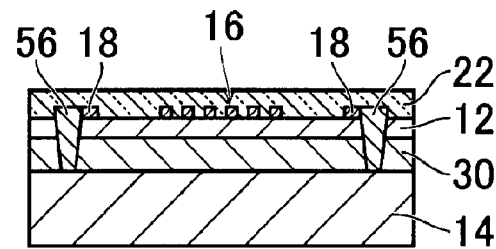
Figure 9F:
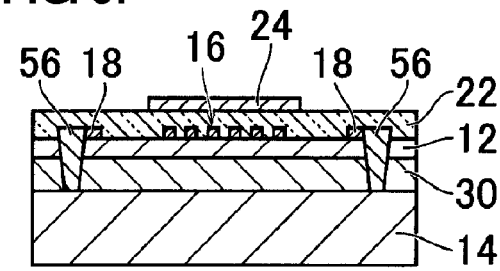
Figure 9G:
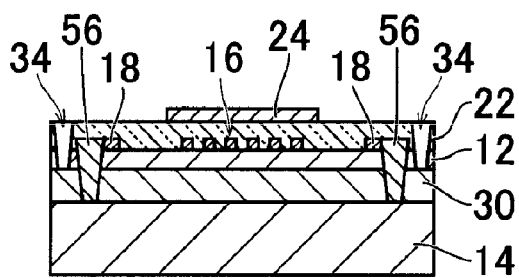
Figure 9H:
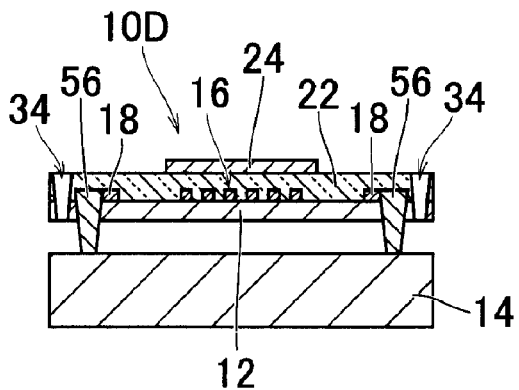

As shown in FIG. 9E, the protective film 22 is formed on the first substrate 12 so as to cover the sensing electrode 16. As shown in FIG. 9F, the infrared-absorbing film 24 is formed on the protective film 22. As shown in FIG. 9G, the groove 34 extending through the protective film 22 and the first substrate 12 is formed so as to surround the sensing electrode 16. As shown in FIG. 9H, the binder 30 is removed by etching or other suitable method, so that the first substrate 12 is supported by the posts 56 while being spaced apart from the second substrate 14. Portions of the protective film 22 and the first substrate 12 located outside the groove 34 and between adjacent sensing electrodes 16 are removed. The second substrate 14 is cut at locations between adjacent sensing electrodes 16 into individual infrared sensors 10D. Alternatively, in FIG. 9E, the infrared-absorbing film 24 may be formed instead of the protective film 22 to eliminate the step shown in FIG. 9F.

In each of the infrared sensors 10D, segments of the sensing electrode 16 are connected to the IC substrate defining the second substrate 14 through the posts 56. Thus, a signal sent from the infrared-sensing portion can be processed in the second substrate 14.

In the production methods according to preferred embodiments of the present invention, the second substrate 14 is cut at locations between adjacent sensing electrodes 16 into individual infrared sensors 10. Alternatively, as shown in FIG. 10, the second substrate 14 on which a plurality of infrared-sensing portions are mounted may be cut into an infrared sensor array 60. In the infrared sensor array 60, the first substrate 12 is connected to the second substrate 14 by only the posts, and the first substrate 12 are spaced apart from the second substrate 14 in the other portion. Furthermore, adjacent first substrates 12 are spaced apart from each other. This results in a satisfactory thermal insulation effect between adjacent infrared-sensing portions, thus preventing crosstalk caused by heat.

Figure 11:
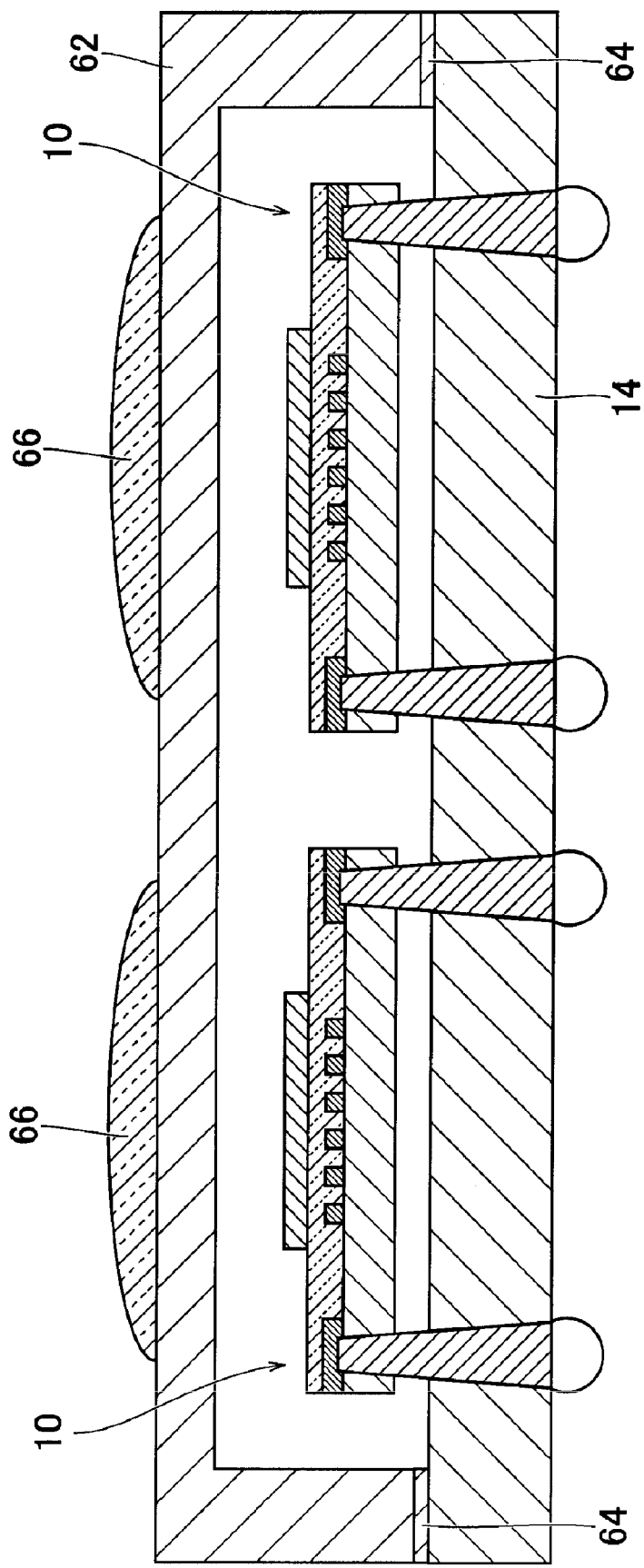
FIG. 11 is an illustrative view of an exemplary infrared sensor array provided with a covering member.

As shown in FIG. 11, the infrared sensor array 60 may include a covering member 62 arranged to cover the first substrate 12. In this case, the covering member 62 is bonded to the second substrate 14 using a binder 64. The covering member 62 is defined by an infrared-transparent substrate that is arranged such that infrared rays incident from the outside reach infrared-sensing portions. Furthermore, convex portions on the covering member 62 may be formed at locations corresponding to the infrared-sensing portions, and condenser lenses 66 arranged to condense infrared rays may be formed at the convex portions.

Figure 12:
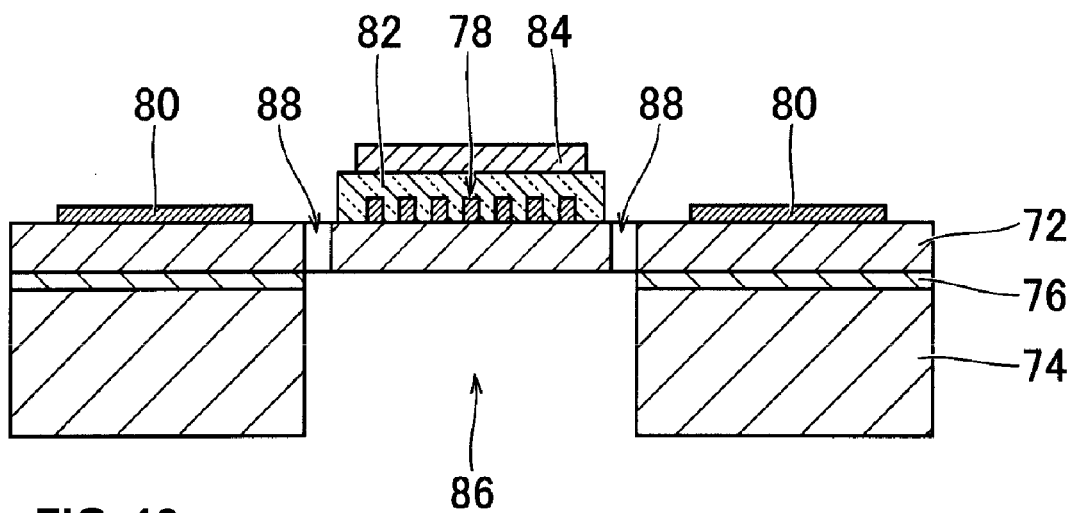
FIG. 12 is a cross-sectional view illustrating an infrared sensor according to another preferred embodiment of the present invention.
Figure 13:
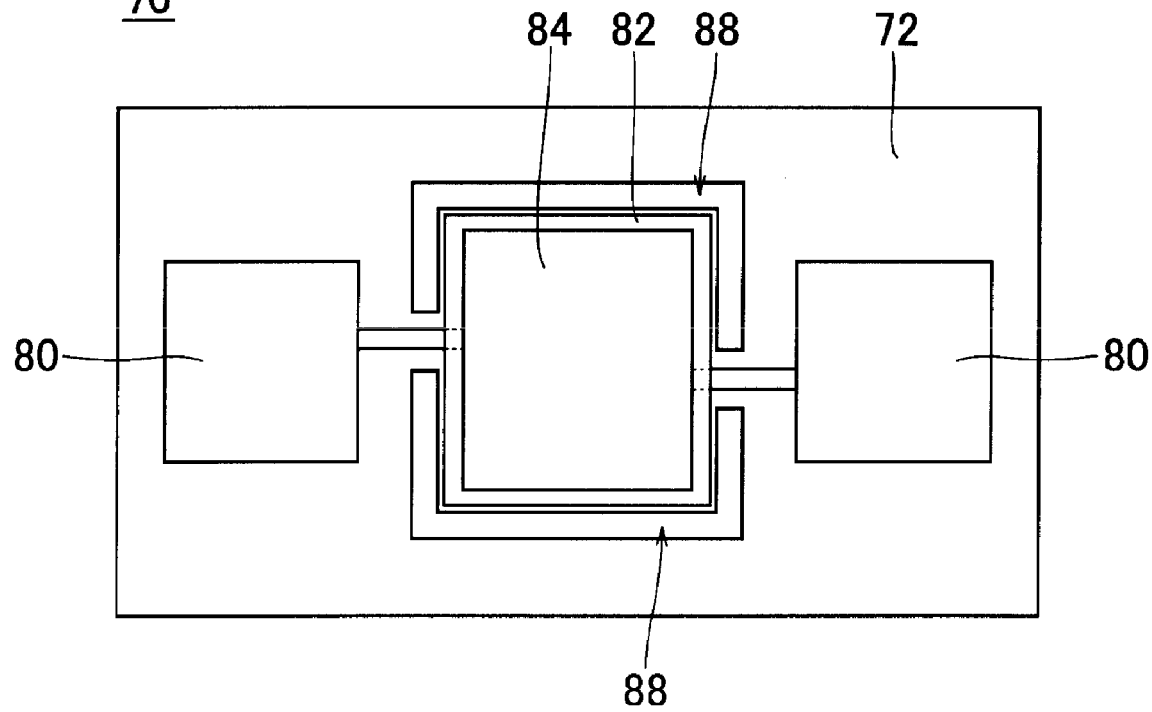
FIG. 13 is a plan view of the infrared sensor shown in FIG. 12.
Figure 14:
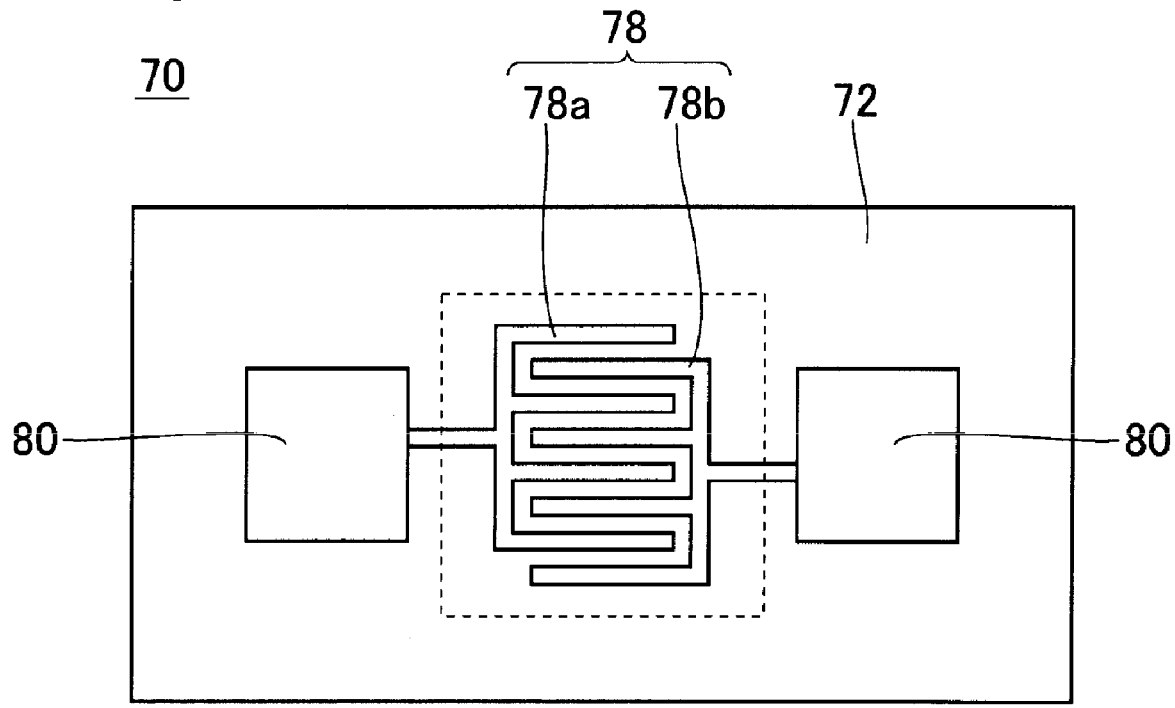
FIG. 14 is an illustrative view of a sensing electrode provided in the infrared sensor shown in FIG. 12.

FIG. 12 is a cross-sectional view illustrating an infrared sensor according to another preferred embodiment of the present invention. FIG. 13 is a plan view of the infrared sensor. An infrared sensor 70 preferably includes a thin first substrate 72 made of a thermoelectric conversion material and a second substrate 74 made of Si, or other suitable material. The first substrate 72 and the second substrate 74 are bonded using a binder 76 made of a resin material, such as a polyimide resin or an epoxy resin, for example. A sensing electrode 78 is formed on the first substrate 72. As shown in FIG. 14, the sensing electrode 78 is defined by interdigitally arranging two comb-shaped electrode segments 78a and 78b. The comb-shaped electrode segments 78a and 78b extend in opposite directions on the first substrate 72 and are connected to respective lead portions 80. An infrared-sensing portion is provided on a portion in which the comb-shaped electrode segments 78a and 78b are provided. The sensing electrode 78 and the lead portions 80 are preferably made of, for example, Al/Ti, Al/NiCr.

Figure 15:
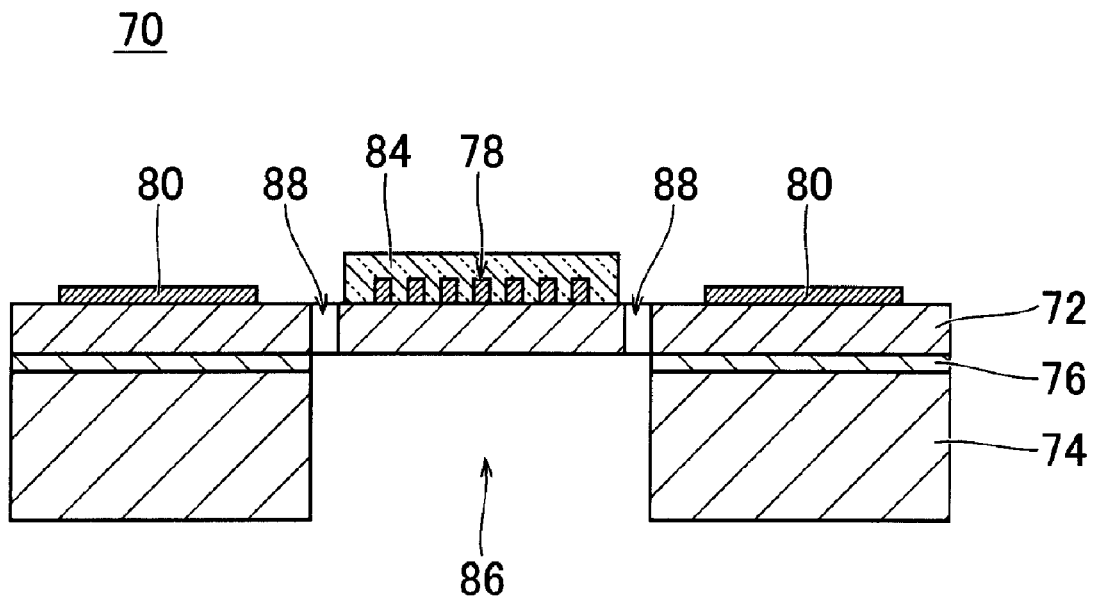
FIG. 15 is a cross-sectional view illustrating an infrared sensor according to another preferred embodiment of the present invention.

A protective film 82 made of an insulating material, such as $SiO_2$ or $Al_2O_3$, for example, is provided on the first substrate 72 so as to cover the portion in which the sensing electrode 78 is arranged. An infrared-absorbing film 84 is provided on a portion of the protective film 82 corresponding to the portion in which the sensing electrode 78 is arranged. The infrared-absorbing film 84 is preferably made of, for example, Au black, NiCr, or TiN. A through hole is provided in a portion of the second substrate 74 substantially corresponding to the portion in which the sensing electrode 78 is arranged, thereby defining a cavity 86. Through slots 88 are provided in the first substrate 72 and around the portion in which the sensing electrode 78 is arranged. The through slots 88 are arranged so as to surround the portion in which the sensing electrode 78 is arranged, except for connecting portions between the sensing electrode 78 and the lead portions 80. FIG. 15 is a cross-sectional view illustrating an infrared sensor according to another preferred embodiment of the present invention. In this preferred embodiment, an infrared-absorbing film 84 is arranged so as to cover the sensing electrode 78. In this manner, the infrared-absorbing film 84 absorbs infrared rays and protects the sensing electrode 78.

In the infrared sensor 70, a portion of the second substrate 74 corresponding to the infrared-sensing portion including the sensing electrode 78 is eliminated to define the cavity 86. At portions in which the lead portions 80 are arranged, the first substrate 72 and the second substrate 74 are bonded. However, the through slot 88 is provided around the infrared-sensing portion. Thus, the infrared-sensing portion is thermally insulated from a portion of the first substrate 72 bonded to the second substrate 74, except for the connecting portions between the sensing electrode 78 and the lead portions 80. Thus, the infrared-sensing portion has a low heat capacity and is thermally insulated from other portions, so that the infrared sensor has excellent thermoelectric conversion efficiency and responsiveness. When an infrared sensor array having a plurality of the infrared-sensing portions having satisfactory thermal insulation is produced, the infrared sensor array has a low level of crosstalk because of only a small influence of heat is imposed on adjacent infrared-sensing portions.

To produce the infrared sensor 70, as shown in FIG. 16A, a plurality of through holes 90 to define the cavities 86 are formed in the second substrate 74 by wet etching, RIE, sand blasting, with a laser, or other suitable method. As shown in FIG. 16B, the binder 76 is formed on one main surface of the second substrate 74 having the through holes 90. As shown in FIG. 16C, the bulk first substrate 72 is bonded to the binder 76. By bonding the first substrate 72 to the binder 76, portions in which the through holes 90 are formed are converted into the cavities 86. As shown in FIG. 16D, the thickness of the first substrate 72 is reduced by polishing, such as lapping, for example.

As shown in FIG. 16E, the sensing electrodes 78 and the lead portions 80 are formed on the first substrate 72. At this point, the sensing electrodes 78 are formed at portions substantially corresponding to the cavities 86 formed in the second substrate 74. As shown in FIG. 16F, through slots 88 are formed in the first substrate 72 and around each sensing electrode 78 with a laser, for example, except at portions extending to the lead portions 80.

As shown in FIG. 16G, the protective films 82 are formed on the first substrate 72 so as to cover the sensing electrodes

78. As shown in FIG. 16H, the infrared-absorbing films 84 are formed on the protective films 82. As shown in FIG. 16I, the second substrate 74 is cut at locations between adjacent sensing electrodes 78 by dicing, with a laser, or by other suitable method, into individual infrared sensors 70. In FIG. 16G, the infrared-absorbing films 84 may be formed instead of the protective films 82 to eliminate the step shown in FIG. 16H.

Figure 17A:
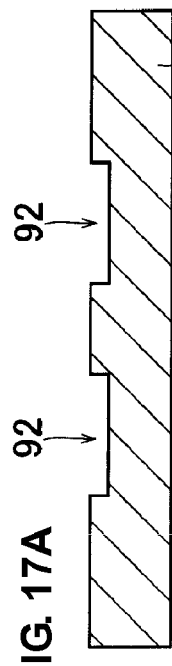
FIGS. 17A to 17I are illustrative views of a method for producing an infrared sensor having a structure different from that of the infrared sensor shown in FIG. 12.
Figure 17B:
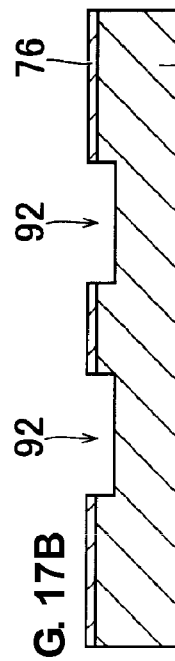
Figure 17C:
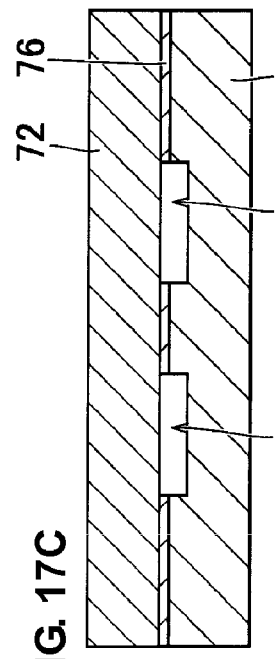
Figure 17D:
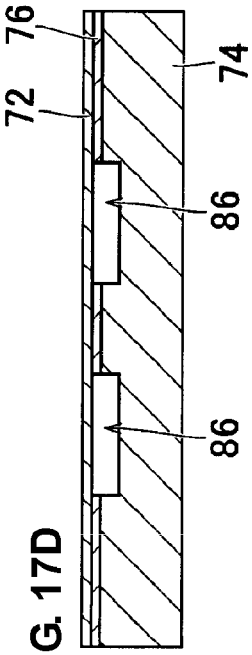

As shown in FIGS. 17A to 17I, recesses formed in the second substrate 74 may be used to define the cavities 86. In this case, as shown in FIG. 17A, a plurality of recesses 92 are formed on one main surface of the second substrate 74. As shown in FIG. 17B, the binder 76 is formed on the side of the second substrate 74 adjacent to the recesses 92. As shown in FIG. 17C, the bulk first substrate 72 is bonded to the binder 76. As shown in FIG. 17D, the thickness of the first substrate 72 is reduced. By bonding the first substrate 72 to the second substrate 74, the recesses 92 are formed into the cavities 86.

Figure 17E:
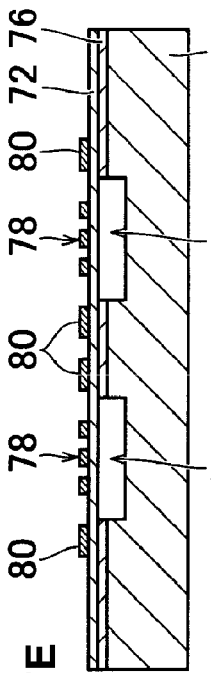
Figure 17F:
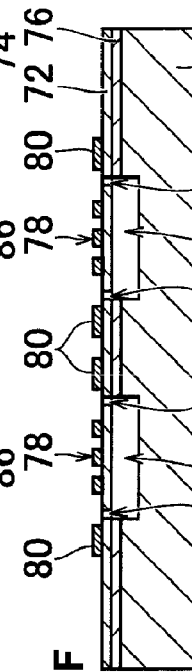

As shown in FIG. 17E, the sensing electrodes 78 and lead portions 80 are formed on the first substrate 72. The sensing electrodes 78 are located at portions substantially corresponding to the cavities 86 formed in the second substrate 74. As shown in FIG. 17F, the through slots 88 are formed in the first substrate 72 and around each sensing electrode 78, except for at portions extending to the lead portions 80.

Figure 17G:
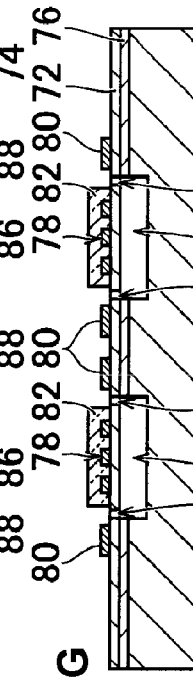
Figure 17H:
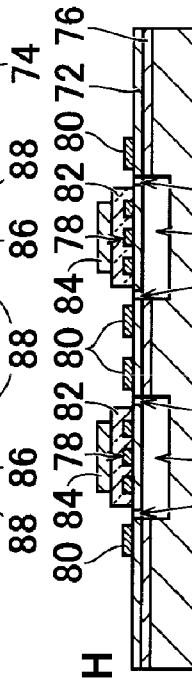
Figure 17I:
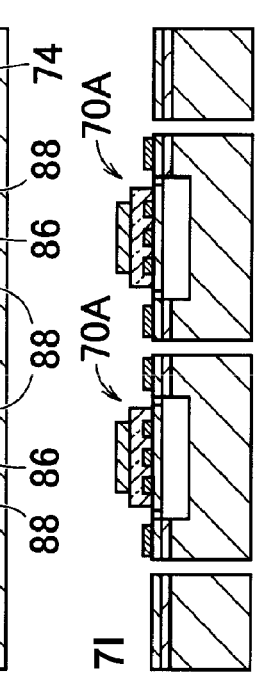

As shown in FIG. 17G, the protective films 82 are formed on the first substrate 72 so as to cover the sensing electrodes 78. As shown in FIG. 17H, the infrared-absorbing films 84 are formed on the protective films 82. As shown in FIG. 17I, the second substrate 74 is cut at locations between adjacent sensing electrodes 78 into individual infrared sensors 70A. In FIG. 17G, the infrared-absorbing films 84 may be formed instead of the protective films 82 to eliminate the step shown in FIG. 17H.

In this manner, satisfactory thermal insulation is provided between adjacent infrared-sensing portions.

Figure 18E:
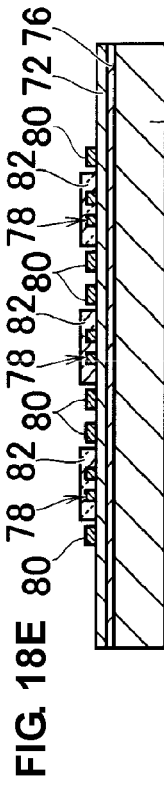
FIGS. 18A to 18I are illustrative views of a method for producing an infrared sensor having another structure different from that of the infrared sensor shown in FIG. 12.
Figure 18F:
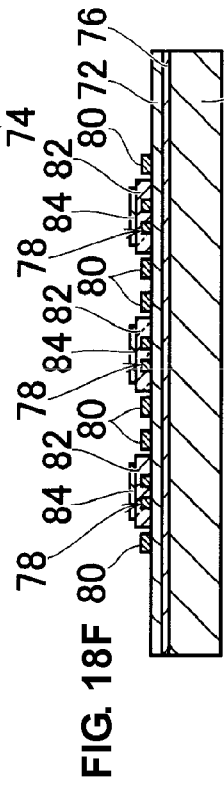
Figure 18G:
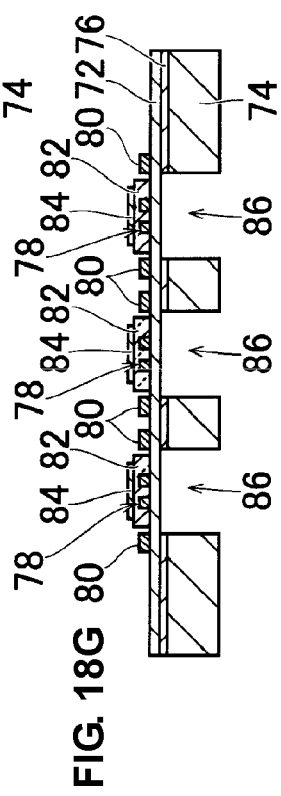
Figure 18H:
Figure 18I:
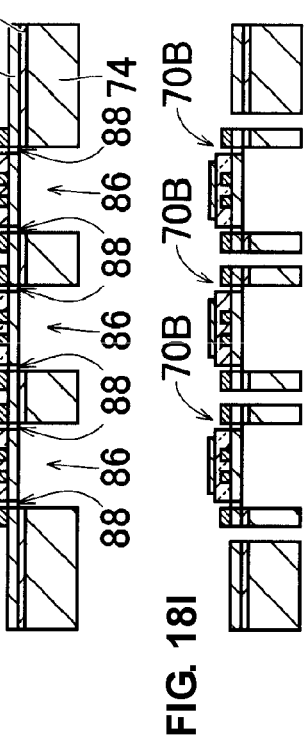
Figure 18A:
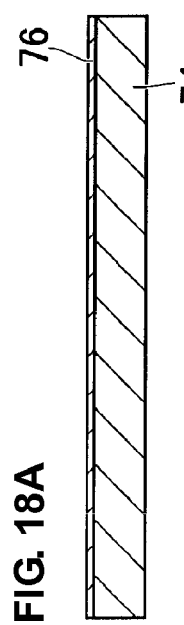
Figure 18B:
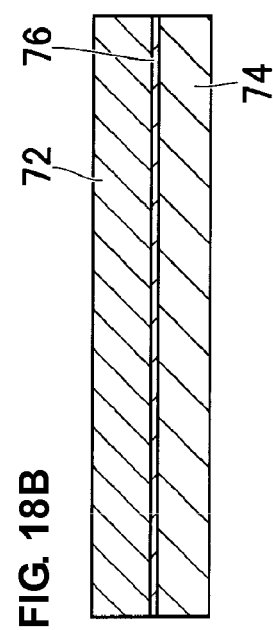
Figure 18C:
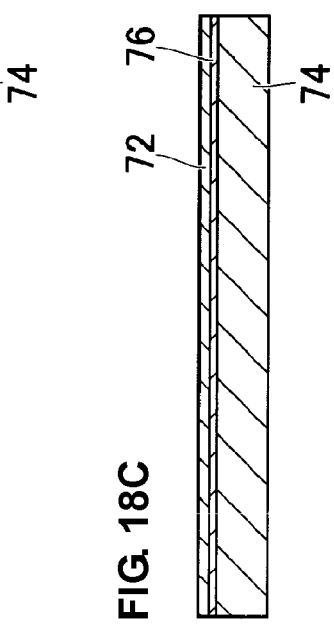

As shown in FIG. 18A to 18I, the cavities 86 may be formed after the first substrate 72 is bonded to the second substrate 74. In this case, as shown in FIG. 18A, the binder 76 is formed on one main surface of the second substrate 74. As shown in FIG. 18B, the first substrate 72 is bonded to the binder 76. As shown in FIG. 18C, the thickness of the first substrate 72 is reduced.

Figure 18D:
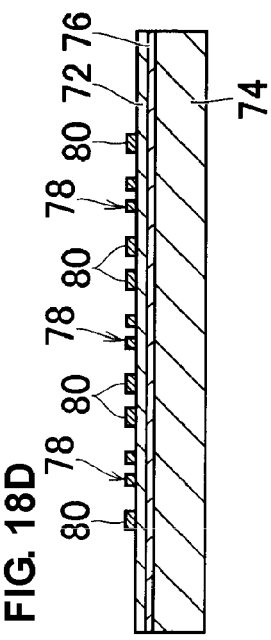
Figure 19A:
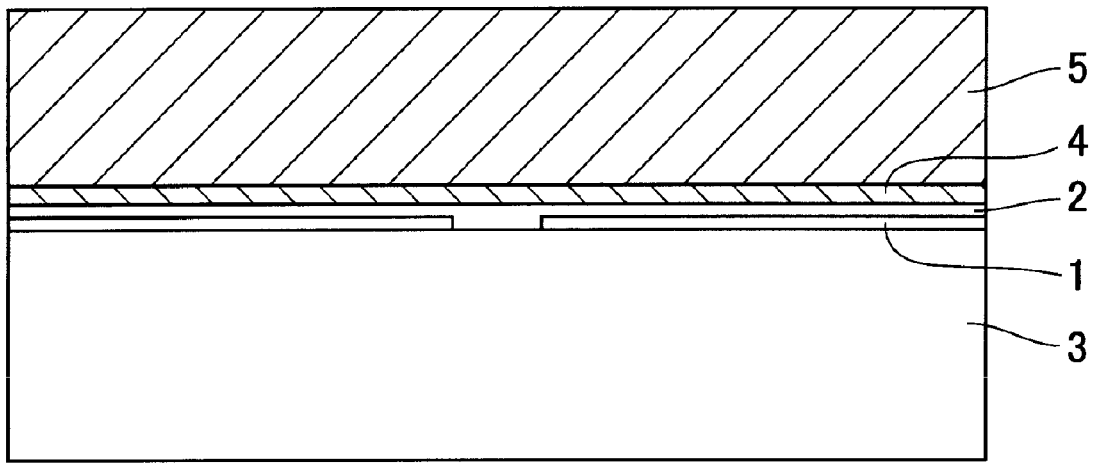
FIGS. 19A to 19C are illustrative views of a method for producing an infrared sensor in the related art.
Figure 19B:
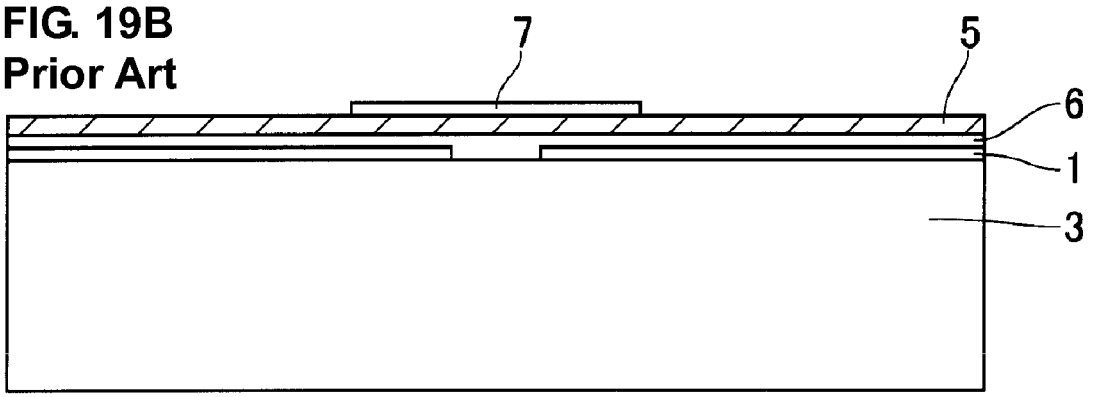
Figure 19C:
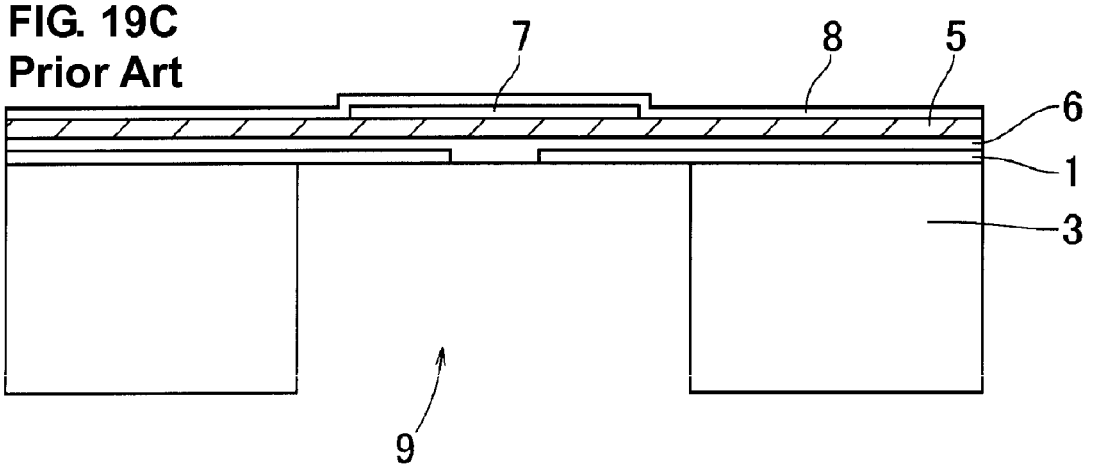

As shown in FIG. 18D, the plurality of sensing electrodes 78 and the lead portions 80 are formed on the first substrate 72. As shown in FIG. 18E, the protective films 82 are formed on the first substrate 72 so as to cover portions in which the sensing electrodes 78 are arranged. As shown in FIG. 18F, the infrared-absorbing films 84 are formed on the protective films 82. In FIG. 18E, the infrared-absorbing films 84 may be formed instead of the protective films 82 to eliminate the step shown in FIG. 18F.

As shown in FIG. 18G, through holes are formed in portions of the second substrate 74 substantially corresponding to the portions in which the sensing electrodes 78 are arranged, thereby forming the cavities 86. The through holes are formed by, for example, wet etching, RIE, sand blasting, with a laser, or both other suitable method. As shown in FIG. 18H, the through slots 88 are formed in the first substrate 72 and around the sensing electrodes 78, except at portions extending to the lead portions 80 and the sensing electrodes 78. As shown in FIG. 18I, the second substrate 74 is cut at locations between adjacent sensing electrodes 78 into individual infrared sensors 70B.

In this manner, the cavities 86 may be formed before the first substrate 72 is bonded to the second substrate 74 or after the first substrate 72 is bonded to the second substrate 74.

With the production methods according to preferred embodiments of the present invention, it is possible to produce an infrared sensor having satisfactory thermal insulation of an infrared-sensing portion, satisfactory thermoelectric conversion efficiency, and good responsiveness.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An infrared sensor comprising:
   a first substrate made of a thermoelectric conversion material;
   a second substrate arranged to be spaced apart from the first substrate such that a main surface of the second substrate faces a main surface of the first substrate;
   a plurality of posts arranged to connect the first substrate and the second substrate and support the first substrate and the second substrate while the first substrate and the second substrate are spaced apart from one another; and
   a sensing electrode arranged on at least one main surface of the first substrate, the sensing electrode sensing infrared rays incident on the first substrate; wherein
   an external terminal connection electrode arranged to be connected to an external circuit is arranged on a main surface of the second substrate opposite the main surface facing the first substrate, and the sensing electrode is electrically connected to the posts and the external terminal connection electrode.

2. The infrared sensor according to claim 1, wherein the posts are arranged so as to extend through at least one of the first substrate and the second substrate.

3. The infrared sensor according to claim 1, wherein the second substrate is an IC substrate.

4. The infrared sensor according to claim 1, further comprising an infrared-absorbing film arranged so as to cover the sensing electrode.

5. The infrared sensor according to claim 1, wherein the first substrate is made of a thermistor material.

6. The infrared sensor according to claim 5, wherein the thermistor material is a $Mn_3O_4$-based material.

7. The infrared sensor according to claim 5, wherein the thermistor material is a $(Ba,Sr)TiO_3$-based material.

8. The infrared sensor according to claim 5, wherein the thermistor material is a $(La,Ba)MnO_3$-based material.

9. The infrared sensor according to claim 1, wherein the first substrate is made of a pyroelectric material.

10. The infrared sensor according to claim 9, wherein the pyroelectric material is a $PbTiO_3$-based material or a $(Pb,Zr)TiO_3$-based material.

11. An infrared sensor array comprising a plurality of the infrared sensors according to claim 1.

12. An infrared sensor comprising:
    a first substrate made of a thermoelectric conversion material;
    a second substrate arranged to be spaced apart from the first substrate such that a main surface of the second substrate faces a main surface of the first substrate;
    a plurality of posts arranged to connect the first substrate and the second substrate and support the first substrate and the second substrate while the first substrate and the second substrate are spaced apart from one another; and
    a sensing electrode arranged on at least one main surface of the first substrate, the sensing electrode sensing infrared rays incident on the first substrate; wherein an interconnection electrode is arranged on a main surface of the second substrate opposite the main surface facing the first substrate, and the sensing electrode is electrically connected to the interconnection electrode.

13. The infrared sensor according to claim 12, wherein the posts are arranged so as to extend through at least one of the first substrate and the second substrate.

14. The infrared sensor according to claim 12, wherein the second substrate is an IC substrate.

15. The infrared sensor according to claim 12, further comprising an infrared-absorbing film arranged so as to cover the sensing electrode.

16. The infrared sensor according to claim 12, wherein the first substrate is made of a thermistor material.

17. The infrared sensor according to claim 12, wherein the first substrate is made of a pyroelectric material.

18. An infrared sensor array comprising a plurality of the infrared sensors according to claim 12.

19. An infrared sensor comprising:
a first substrate made of a thermoelectric conversion material;
a sensing electrode arranged on at least one main surface of the first substrate, the sensing electrode being arranged to sense infrared rays incident on the first substrate;
a second substrate bonded to the first substrate to support the first substrate;
a cavity arranged in a portion of the second substrate substantially corresponding to a portion of the first substrate in which the sensing electrode is arranged; and
a through slot arranged in the first substrate and around the portion of the first substrate in which the sensing electrode is arranged.

20. The infrared sensor according to claim 19, wherein the cavity is arranged so as to extend through the second substrate.

21. The infrared sensor according to claim 19, wherein the cavity is defined by a recess located in a portion of the second substrate substantially corresponding to the portion of the first substrate in which the sensing electrode is arranged.

22. An infrared sensor comprising:
a first substrate made of a thermoelectric conversion material;
a second substrate arranged to be spaced apart from the first substrate such that a main surface of the second substrate faces a main surface of the first substrate;
a plurality of posts arranged to connect the first substrate and the second substrate and support the first substrate and the second substrate while the first substrate and the second substrate are spaced apart from one another;
a sensing electrode arranged on at least one main surface of the first substrate, the sensing electrode sensing infrared rays incident on the first substrate;
a protective film arranged so as to cover the sensing electrode; and
an infrared-absorbing film arranged on a portion of the protective film substantially corresponding to the portion of the first substrate in which the sensing electrode is arranged.

23. The infrared sensor according to claim 22, wherein the posts are arranged so as to extend through at least one of the first substrate and the second substrate.

24. The infrared sensor according to claim 22, wherein the second substrate is an IC substrate.

25. The infrared sensor according to claim 22, further comprising an infrared-absorbing film arranged so as to cover the sensing electrode.

26. The infrared sensor according to claim 22, wherein the first substrate is made of a thermistor material.

27. The infrared sensor according to claim 22, wherein the first substrate is made of a pyroelectric material.

28. An infrared sensor array comprising a plurality of the infrared sensors according to claim 22.

29. A method for producing an infrared sensor, comprising the steps of:
preparing a first substrate made of a thermoelectric conversion material;
preparing a second substrate;
bonding a main surface of the first substrate to a main surface of the second substrate using a binder;
reducing the thickness of the first substrate;
forming a sensing electrode on a main surface of the first substrate having a reduced thickness, the sensing electrode sensing infrared rays incident on the first substrate;
forming a post extending through the binder to connect the first substrate to the second substrate; and
removing the binder.

30. The method for producing an infrared sensor according to claim 29, wherein the step of forming the post includes a substep of forming a through hole extending through the second substrate and the binder and communicating with the first substrate, and a substep of forming an electrode in the through hole to form the post.

31. The method for producing an infrared sensor according to claim 30, wherein the post is formed so as to be connected to the sensing electrode, and the method further comprises a step of forming an external terminal connection electrode on a main surface of the second substrate opposite the main surface facing the first substrate, the external terminal connection electrode being connected to the post and arranged to be connected to an external circuit.

32. The method for producing an infrared sensor according to claim 29, wherein the step of forming the post includes a substep of forming a through hole extending through the first substrate and the binder and communicating with the second substrate, and a substep of forming an electrode in the through hole to form the post.

33. The method for producing an infrared sensor according to claim 32, further comprising the steps of forming an interconnection electrode on the main surface of the second substrate facing the first substrate before bonding the first substrate to the second substrate, and connecting the post to the interconnection electrode when forming the post, so that the sensing electrode is connected to the post and the interconnection electrode.

34. The method for producing an infrared sensor according to claim 33, further comprising the steps of forming a through hole extending through the second substrate and communicating with the interconnection electrode after forming the post, forming an electrode in the through hole extending through the second substrate, and forming an external terminal connection electrode on a main surface of the second substrate opposite the main surface facing the first substrate, the external terminal connection electrode being arranged to be connected to an external circuit that is to be connected to the electrode extending through the second substrate.

35. The method for producing an infrared sensor according to claim 32, wherein the second substrate is an IC substrate, and the sensing electrode is connected to a circuit arranged on the second substrate through the post.

36. The method for producing an infrared sensor according to claim 29, wherein the step of removing the binder is performed by isotropic etching.

37. The method for producing an infrared sensor according to claim 29, further comprising the steps of forming a groove in the first substrate and around the sensing electrode, and removing a portion of the first substrate located outside the groove arranged around the sensing electrode.

38. The method for producing an infrared sensor according to claim 29, further comprising a step of forming an infrared-absorbing film such that the infrared-absorbing film covers the sensing electrode.

39. The method for producing an infrared sensor according to claim 29, further comprising the steps of forming a protective film such that the protective film covers the sensing electrode, and forming an infrared-absorbing film on a portion of the protective film substantially corresponding to a portion of the first substrate in which the sensing electrode is arranged.

40. A method for producing an infrared sensor, comprising the steps of:
   preparing a first substrate made of a thermoelectric conversion material;
   preparing a second substrate;
   forming a first interconnection electrode on a main surface of the first substrate;
   forming a second interconnection electrode on a main surface of the second substrate;
   bonding the first interconnection electrode to the second interconnection electrode to form a post arranged to stack the first substrate and the second substrate so as to face each other;
   reducing the thickness of the first substrate; and
   forming a sensing electrode on a main surface of the first substrate, the sensing electrode sensing infrared rays incident on the first substrate.

41. The method for producing an infrared sensor according to claim 40, further comprising the steps of forming a through hole in the first substrate after forming the sensing electrode, the through hole communicating with the sensing electrode and the first interconnection electrode, forming an electrode in the through hole arranged in the first substrate to connect the sensing electrode to the first interconnection electrode, forming a through hole in the second substrate, the through hole communicating with the second interconnection electrode, forming an electrode in the through hole arranged in the second substrate, and forming an external terminal connection electrode on a main surface of the second substrate opposite the main surface facing the first substrate such that the external terminal connection electrode is connected to the electrode arranged in the through hole in the second substrate, the external terminal connection electrode being arranged to be connected to an external circuit.

42. A method for producing an infrared sensor, comprising the steps of:
   preparing a first substrate made of a thermoelectric conversion material;
   preparing a second substrate;
   forming a through hole in the second substrate;
   bonding a main surface of the first substrate to a main surface of the second substrate having the through hole;
   reducing the thickness of the first substrate;
   forming a sensing electrode on a portion of a main surface of the first substrate substantially corresponding to the through hole, the sensing electrode sensing infrared rays incident on the first substrate; and
   forming a through slot in the first substrate and around the sensing electrode.

43. A method for producing an infrared sensor, comprising the steps of:
   preparing a first substrate made of a thermoelectric conversion material;
   preparing a second substrate;
   forming a recess in a main surface of the second substrate;
   bonding a main surface of the first substrate to the main surface of the second substrate having the recess;
   reducing the thickness of the first substrate;
   forming a sensing electrode on a portion of a main surface of the first substrate substantially corresponding to the recess, the sensing electrode sensing infrared rays incident on the first substrate; and
   forming a through slot in the first substrate and around the sensing electrode.

44. A method for producing an infrared sensor, comprising the steps of:
   preparing a first substrate made of a thermoelectric conversion material;
   preparing a second substrate;
   bonding a first main surface of the first substrate to a main surface of the second substrate;
   reducing the thickness of the first substrate;
   forming a sensing electrode on a second main surface of the first substrate, the sensing electrode sensing infrared rays incident on the first substrate;
   forming a through hole in a portion of the second substrate substantially corresponding to the sensing electrode to form a cavity on the first main surface side of the first substrate; and
   forming a through hole in the first substrate and around the sensing electrode.

* * * * *